US012563809B2

(12) United States Patent
Min et al.

(10) Patent No.: US 12,563,809 B2
(45) Date of Patent: Feb. 24, 2026

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Shin Cheol Min, Seoul (KR); Keon Yong Cheon, Yongin-si (KR); Myung Dong Ko, Hwaseong-si (KR); Yong Hee Park, Hwaseong-si (KR); Sang Hyeon Lee, Gwangju-si (KR); Dong Won Kim, Seongnam-si (KR); Woo Seung Shin, Siheung-si (KR); Hyung Suk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 749 days.

(21) Appl. No.: 17/879,134

(22) Filed: Aug. 2, 2022

(65) Prior Publication Data

US 2023/0122379 A1     Apr. 20, 2023

(30) Foreign Application Priority Data

Oct. 14, 2021     (KR) ........................ 10-2021-0136563

(51) Int. Cl.
H10D 64/23          (2025.01)
H10D 30/01          (2025.01)
(Continued)

(52) U.S. Cl.
CPC ......... H10D 64/258 (2025.01); H10D 30/014 (2025.01); H10D 30/031 (2025.01);
(Continued)

(58) Field of Classification Search
CPC .. H10D 64/258; H10D 30/014; H10D 30/031; H10D 30/43; H10D 62/151;
(Continued)

(56) References Cited

U.S. PATENT DOCUMENTS 9,997,613 B2     6/2018  Chang et al.
10,177,226 B2    1/2019  Guillorn et al.
(Continued)

FOREIGN PATENT DOCUMENTS

KR     1020190024600 A     3/2019
KR     1020210096400 A     8/2021

*Primary Examiner* — Wael M Fahmy
*Assistant Examiner* — Fernando Jose Ramos-Diaz
(74) *Attorney, Agent, or Firm* — Muir Patent Law, PLLC

(57)          ABSTRACT

A semiconductor device includes an active pattern with a lower pattern and sheet patterns spaced apart from the lower pattern, a gate structure on the lower pattern and having a gate electrode and a gate insulating film that surround each of the sheet patterns, a gate capping pattern on the gate structure, a gate etching stop pattern between the gate capping pattern and the gate structure, a gate spacer along a sidewall of the gate capping pattern, a source/drain pattern on the gate structure, a gate contact through the gate capping pattern and connected to the gate electrode, upper surfaces of the gate contact and gate spacer being coplanar, and a source/drain contact on the source/drain pattern and connected to the source/drain pattern.

20 Claims, 30 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |

(52) U.S. Cl.
CPC ......... *H10D 30/43* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 64/017* (2025.01)

(58) Field of Classification Search
CPC ........... H10D 30/6735; H10D 30/0191; H10D 30/502–506; H01L 29/775
See application file for complete search history.

(56) References Cited

U.S. PATENT DOCUMENTS

| | | | |
|---|---|---|---|
| 10,615,256 B2 | 4/2020 | Cheng et al. | |
| 10,886,368 B2 | 1/2021 | Zhang et al. | |
| 11,049,979 B2 | 6/2021 | Miao et al. | |
| 2020/0027959 A1 | 1/2020 | Cheng et al. | |
| 2020/0035820 A1 | 1/2020 | Zhang et al. | |
| 2020/0075719 A1 | 3/2020 | Cheng et al. | |
| 2021/0098588 A1 | 4/2021 | Chung et al. | |
| 2021/0126134 A1 | 4/2021 | Ferng | |
| 2022/0093512 A1* | 3/2022 | Chang .................. | H10D 84/038 |
| 2023/0015572 A1* | 1/2023 | Khaderbad ....... | H01L 21/76825 |

* cited by examiner

FIG. 7

125P
SC_P
ACT_P
SC_P
ACT_P ⎫U_AP
SC_P
ACT_P
SC_P

105

100

B                                                                    B
BP2                              BP1

D3
D2
D1

SEMICONDUCTOR DEVICE AND METHOD FOR MANUFACTURING THE SAME

CROSS-REFERENCE TO RELATED APPLICATION

This application claims priority from Korean Patent Application No. 10-2021-0136563, filed on Oct. 14, 2021, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device, and more specifically, to a semiconductor device including a MBCFET™ (Multi-Bridge Channel Field Effect) Transistor.

2. Description of Related Art

One of scaling schemes for increasing an integration density of a semiconductor device proposes a multi-gate transistor in which a multi-channel active pattern (or a silicon body) in a shape of a fin or a nanowire is formed on a substrate, and a gate is formed on a surface of the multi-channel active pattern. Because such a multi-gate transistor uses a three-dimensional channel, it is easy to scale the same. Further, current control capability of the multi-gate transistor may be improved without increasing a gate length of the multi-gate transistor. In addition, the multi-gate transistor may effectively suppress SCE (short channel effect) in which potential of a channel area is affected by drain voltage.

SUMMARY

According to an aspect of the present disclosure, there is provided a semiconductor device including, an active pattern including, a lower pattern extending in a first direction and a plurality of sheet patterns spaced apart from the lower pattern in a second direction, wherein each of the sheet patterns has an upper surface and a bottom surface opposite to each other in the second direction, a gate structure disposed on the lower pattern, and including a gate electrode and a gate insulating film, wherein the gate electrode and the gate insulating film surround each of the plurality of sheet patterns, a gate capping pattern disposed on the gate structure and extending along an upper surface of the gate structure, a gate etching stop pattern disposed between the gate capping pattern and the gate structure, a gate spacer extending along a side wall of the gate capping pattern, a source/drain pattern disposed on at least one side of the gate structure, a gate contact disposed on the gate electrode, and extending through the gate capping pattern and connected to the gate electrode, wherein an upper surface of the gate contact is coplanar with an upper surface of the gate spacer; and a source/drain contact disposed on the source/drain pattern and connected to the source/drain pattern.

According to an aspect of the present disclosure, there is provided a semiconductor device including, an active pattern including, a lower pattern extending in a first direction and a plurality of sheet patterns spaced apart from the lower pattern in a second, wherein each of the sheet patterns has an upper surface and a bottom surface opposite to each other in the second direction, a gate structure disposed on the lower pattern, and including a gate electrode and a gate insulating film, wherein the gate electrode and the gate insulating film surround each of the plurality of sheet patterns, a gate capping pattern disposed on the gate structure and extending along an upper surface of the gate structure, a gate etching stop pattern disposed between the gate capping pattern and the gate structure, a gate spacer extending along a side wall of the gate capping pattern, a source/drain pattern disposed on at least one side of the gate structure, a gate contact disposed on the gate electrode, and extending through the gate capping pattern and connected to the gate electrode, a source/drain contact disposed on the source/drain pattern and connected to the source/drain pattern, wherein the gate structure include a plurality of inter gate structures including an inter gate structure disposed between the lower pattern and the sheet pattern, an inter gate structure disposed between adjacent sheet patterns, and an inter gate structure in contact with the source/drain pattern.

According to an aspect of the present disclosure, there is provided a semiconductor device including, an active pattern including, a lower pattern extending in a first direction; and a plurality of sheet patterns spaced apart from the lower pattern in a second direction, wherein each of the sheet patterns has an upper surface and a bottom surface opposite to each other in the second direction, a field insulating film covering a side wall of the lower pattern, a gate structure disposed on the lower pattern and the field insulating film, extending in a third direction, and including a gate electrode and a gate insulating film, wherein the gate electrode and the gate insulating film surround each of the plurality of sheet patterns, a gate etching stop pattern disposed on the gate structure, overlapping the sheet pattern in the second direction, and non-overlapping the field insulating film in the second direction, a gate capping pattern disposed on the gate structure and the gate etching stop pattern, a gate spacer extending along a side wall of the gate capping pattern, a source/drain pattern disposed on at least one side of the gate structure, a gate contact disposed on the gate electrode, extending through the gate capping pattern, and connected to the gate electrode, wherein an upper surface of the gate contact is coplanar with an upper surface of the gate spacer; and a source/drain contact disposed on the source/drain pattern, and connected to the source/drain pattern, wherein in an area in which the gate structure overlaps the field insulating film, a vertical distance from an upper surface of the lower pattern to an upper surface of the gate structure is a first vertical distance, wherein in an area in which the gate structure overlaps the sheet pattern, a vertical distance from the upper surface of the lower pattern to an upper surface of the gate structure is a second vertical distance, wherein the second vertical distance is greater than the first vertical distance.

BRIEF DESCRIPTION OF DRAWINGS

Features will become apparent to those of skill in the art by describing in detail exemplary embodiments with reference to the attached drawings, in which:

FIGS. 6 and 7 are view of the semiconductor device according to some embodiments.

DETAILED DESCRIPTION

The term "first direction D1," "second direction D2," and "third direction D3" used hereinafter should not be interpreted only to have a geometric relationship in which the first direction, the second direction, and the third direction are perpendicular to each other. The "first direction D1," "second direction D2," and "third direction D3" may be interpreted to have a broader direction within a range in which components herein may work functionally.

A semiconductor device according to some embodiments may include a tunneling field effect transistor (tunneling FET), a 3-dimensional (3D) transistor, or a transistor (2D material-based FETs) based on a 2D material, and a heterostructure thereof. Further, the semiconductor device according to some embodiments may include a bipolar junction transistor, a LDMOS (lateral double diffused metal oxide semiconductor) transistor, and the like.

Figure 1:
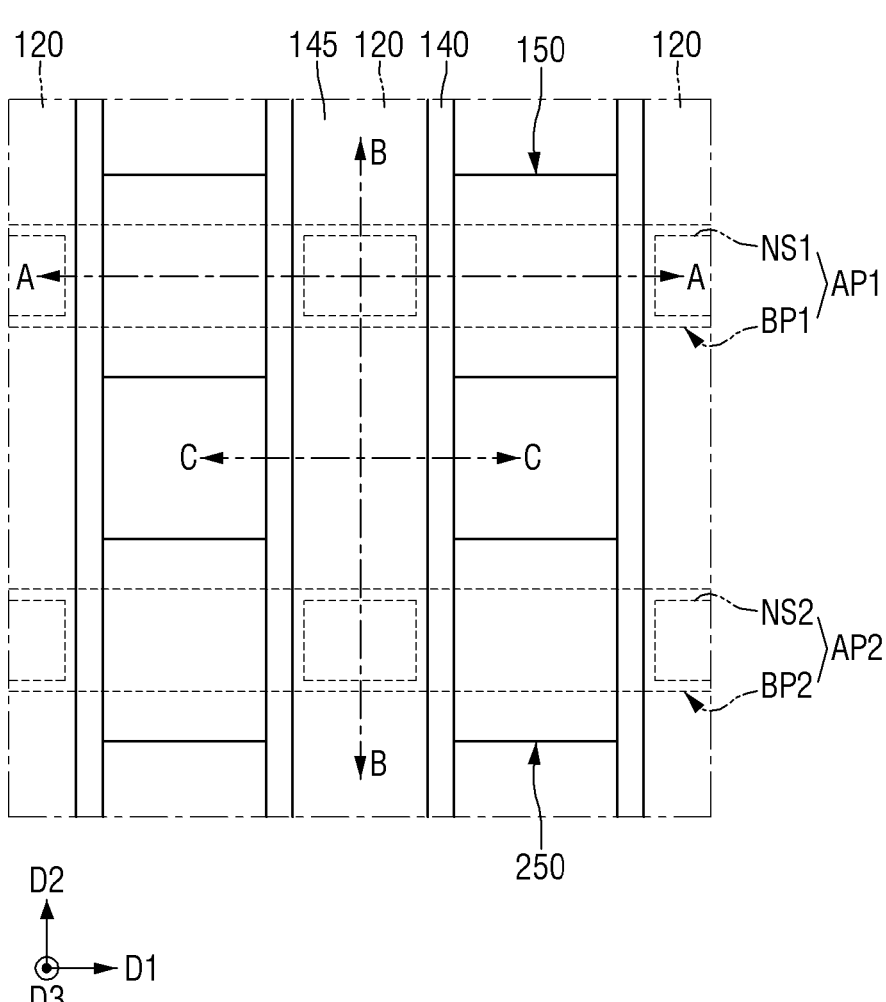
FIG. 1 is a plan view of a semiconductor device according to some embodiments.
Figure 2:
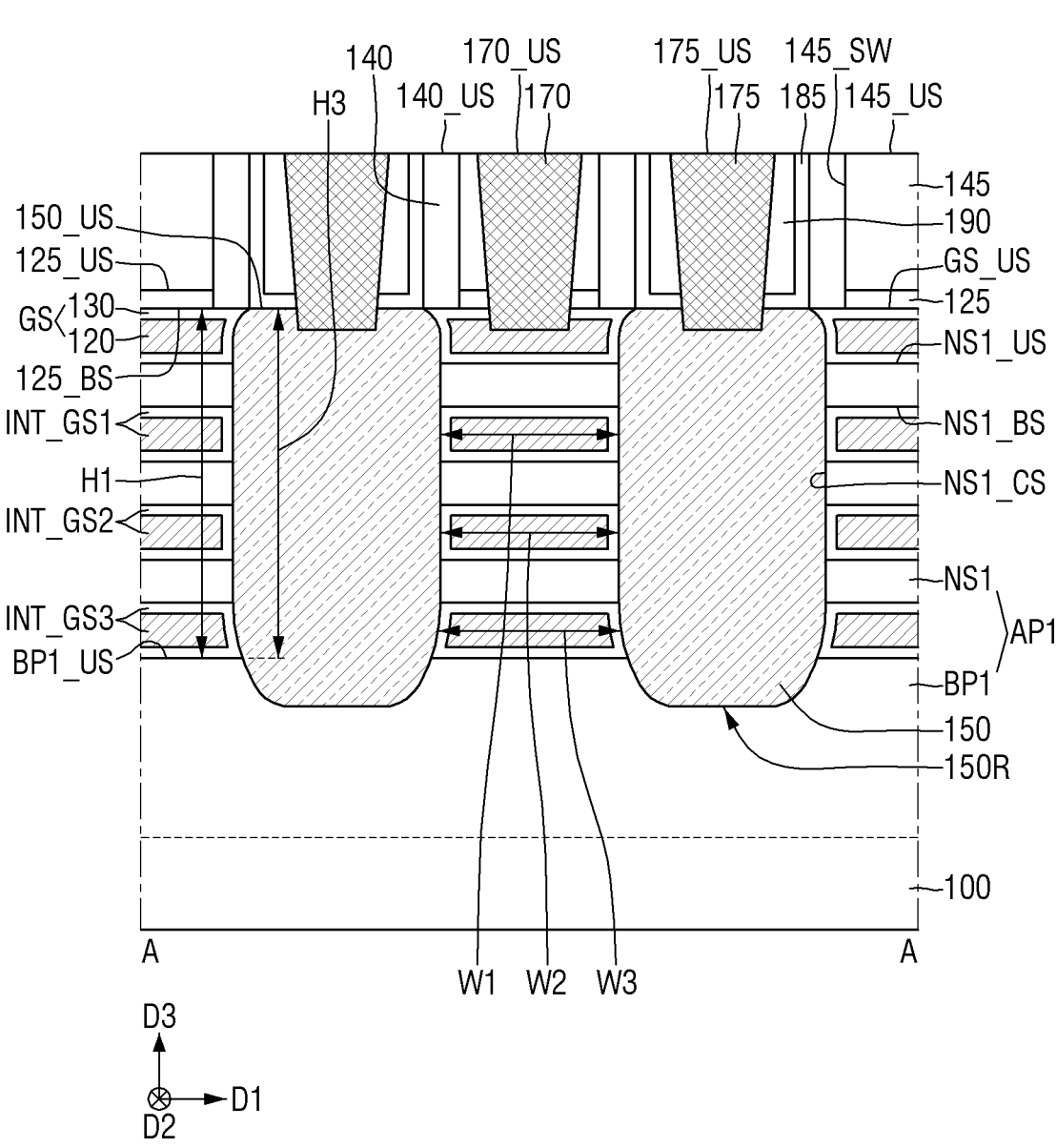
FIGS. 2 to 4 are cross-sectional views along lines A-A, B-B and C-C of FIG. 1, respectively.
Figure 3:
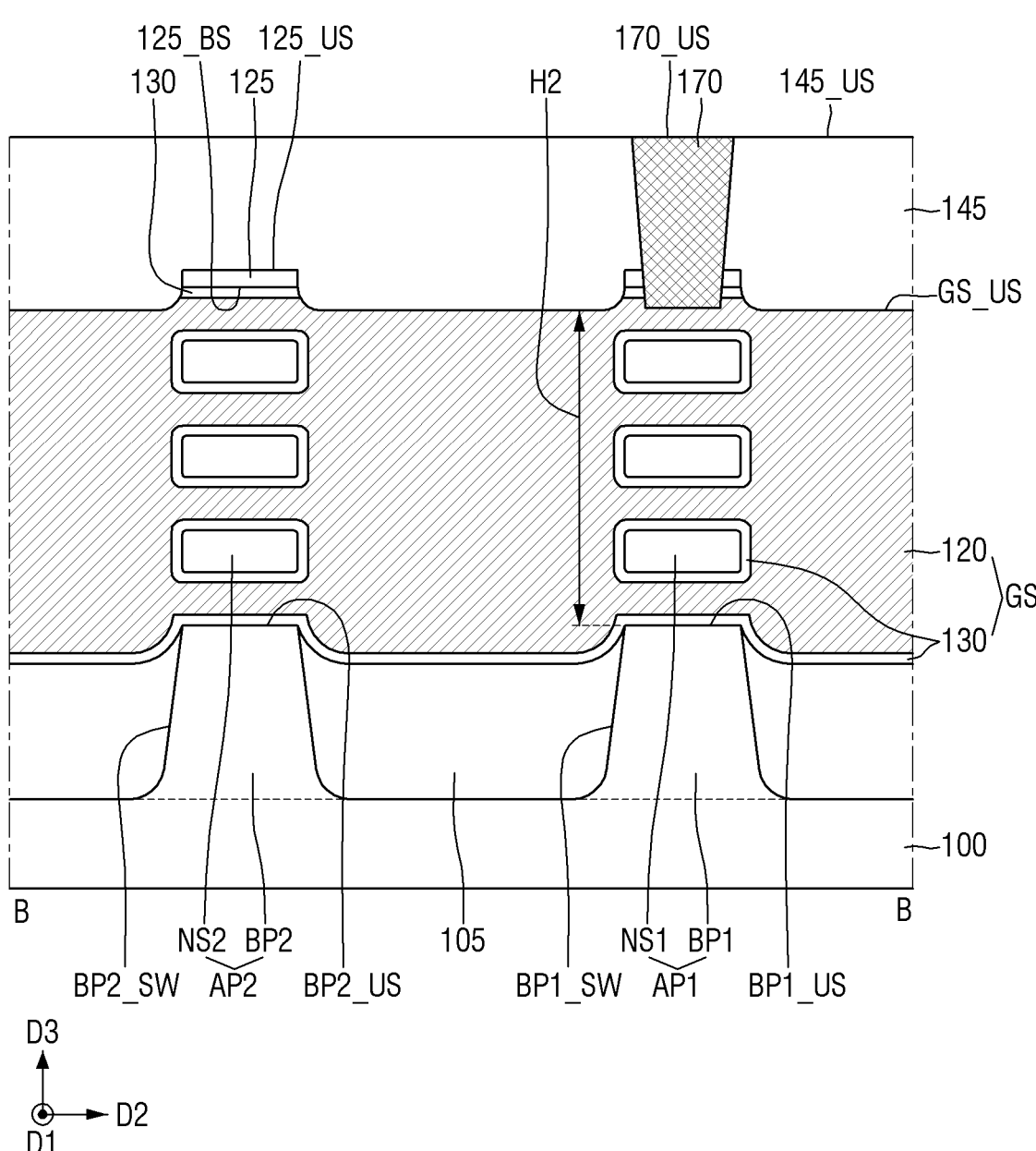
Figure 4:
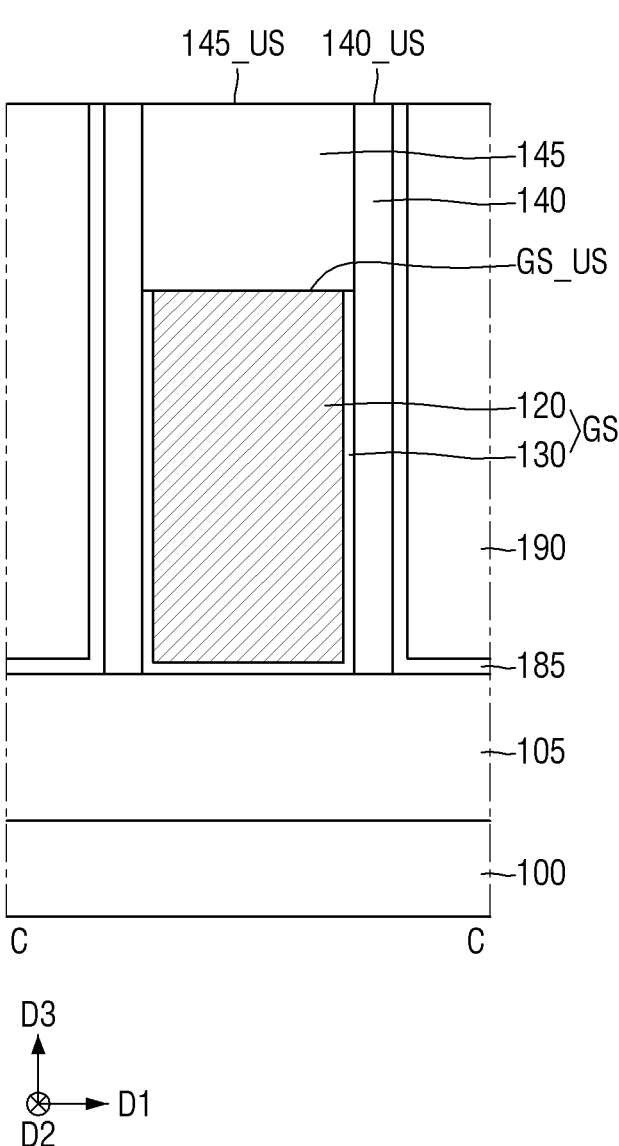

With reference to FIG. 1 to FIG. 4, descriptions will be made of a semiconductor device according to some embodiments. FIG. 1 is an example plan view of a semiconductor device according to some embodiments. FIG. 2 to FIG. 4 are cross-sectional views taken along lines A-A, B-B and C-C of FIG. 1, respectively. In FIG. 1, the device is shown briefly while a gate insulating film 130, a gate contact 170, a source/drain contact 175, an etching stop film 185, and an interlayer insulating film 190 are not shown (omitted) for convenience of illustration.

Referring to FIG. 1 to FIG. 4, a semiconductor device according to some embodiments may include a first active pattern AP1, a second active pattern AP2, a plurality of gate structures GS, a gate etching stop pattern 125, and a source/drain pattern 150 on a substrate 100.

For example, the substrate 100 may be made of bulk silicon or SOI (silicon-on-insulator). In another example, the substrate 100 may be embodied as a silicon substrate, or may be made of a material other than silicon, e.g., silicon germanium, SGOI (silicon germanium on insulator), indium antimonide, lead telluride, indium arsenide, indium phosphide, gallium arsenide, or gallium antimonide.

Each of the first active pattern AP1 and the second active pattern AP2 may be disposed on the substrate 100. Each of the first active pattern AP1 and the second active pattern AP2 may extend in the first direction D1. The first active pattern AP1 and the second active pattern AP2 may be disposed to be spaced apart from each other in the second direction D2. For example, the first direction D1 is a direction intersecting the second direction D2. The first active pattern AP1 may be adjacent to the second active pattern AP2 in the second direction D2.

In one example, one of the first active pattern AP1 and the second active pattern AP2 may act as an area in which a PMOS is formed, and the other thereof may act as an area in which an NMOS is formed. In another example, each of the first active pattern AP1 and the second active pattern AP2 may act as an area in which an NMOS is formed. In still another example, each of the first active pattern AP1 and the second active pattern AP2 may act as an area in which a PMOS is formed.

Each of the first active pattern AP1 and the second active pattern AP2 may be a multi-channel active pattern. The first active pattern AP1 may include a first lower pattern BP1 and a plurality of first sheet patterns NS1. The second active pattern AP2 may include a second lower pattern BP2 and a plurality of second sheet patterns NS2.

Each of the first lower pattern BP1 and the second lower pattern BP2 may protrude from the substrate 100. Each of the first lower pattern BP1 and the second lower pattern BP2 may extend in the first direction D1.

The first lower pattern BP1 may be spaced apart from the second lower pattern BP2 in the second direction D2. The first lower pattern BP1 and the second lower pattern BP2 may be spaced from each other via a fin trench extending in the first direction D1.

The plurality of first sheet patterns NS1 may be disposed on the first lower pattern BP1. The plurality of first sheet patterns NS1 may be spaced apart from the first lower pattern BP1 in the third direction D3. The plurality of first sheet patterns NS1 spaced apart from each other may be arranged, e.g., extend, in the first direction D1 and along an upper surface BP1_US of the first lower pattern.

The plurality of second sheet patterns NS2 may be disposed on the second lower pattern BP2. The plurality of second sheet patterns NS2 may be spaced apart from the second lower pattern BP2 in the third direction D3. In a similar manner to that shown in FIG. 2, the plurality of second sheet patterns NS2 spaced apart from each other may be arranged, e.g., extend, in the first direction D1 and along an upper surface BP2_US of the second lower pattern.

Each of the first sheet patterns NS1 may include a plurality of nanosheets sequentially arranged in the third direction D3. Each of the second sheet patterns NS2 may include a plurality of nanosheets sequentially arranged in the third direction D3.

The third direction D3 may be a direction intersecting the first direction D1 and the second direction D2. For example, the third direction D3 may be a thickness direction of the substrate 100. The first direction D1 may be a direction intersecting the second direction D2.

Each of the first sheet patterns NS1 may include an upper surface NS1_US and a bottom surface NS1_BS. The upper surface NS1_US of the first sheet pattern is opposite to the bottom surface NS1_BS of the first sheet pattern in the third direction D3. Each of the first sheet patterns NS1 may include a connective surface NS1_CS extending in the third direction D3.

The upper surface NS1_US of the first sheet pattern and the bottom surface NS1_BS of the first sheet pattern may be connected to each other via the connective surface NS1_CS of the first sheet pattern. The connective surface NS1_CS of the first sheet pattern may be connected to and in, e.g., direct, contact with the first source/drain pattern 150 to be described later. The connective surface NS1_CS of the first sheet pattern may be a boundary surface between the first sheet pattern NS1 and the first source/drain pattern 150.

Although not shown, descriptions of the second sheet pattern NS2 may be substantially the same as the descriptions of the first sheet pattern NS1. Further, although each of the first sheet pattern NS1 and the second sheet pattern NS2 is shown to include three nanosheets arranged in the third direction D3, this is intended only for convenience of description, and any suitable number of nanosheets may be used.

Each of the first lower pattern BP1 and the second lower pattern BP2 may be formed by etching a portion of the substrate 100, or may include an epitaxial layer grown from the substrate 100. Each of the first lower pattern BP1 and the second lower pattern BP2 may include silicon or germanium as an elemental semiconductor material. Further, each of the first lower pattern BP1 and the second lower pattern BP2 may include a compound semiconductor, e.g., a group IV-IV compound semiconductor or a group III-V compound semiconductor.

For example, the group IV-IV compound semiconductor may include a binary compound including two of, e.g., carbon (C), silicon (Si), germanium (Ge), and tin (Sn), a ternary compound including three thereof, or a compound obtained by doping a group IV element thereto. For example, the group III-V compound semiconductor may include a binary compound obtained by combining one of, e.g., aluminum (Al), gallium (Ga), and indium (In) as a group III element, and one of, e.g., phosphorus (P), arsenic (As), and antimony (Sb) as a group V element, with each other, a ternary compound obtained by combining two of, e.g., aluminum (Al), gallium (Ga), and indium (In) as a group III element, and one of, e.g., phosphorus (P), arsenic (As), and antimony (Sb) as a group V with each other, or a quaternary compound obtained by combining three of, e.g., aluminum (Al), gallium (Ga), and indium (In) as a group III element, and one of, e.g., phosphorus (P), arsenic (As), and antimony (Sb) as a group V with each other.

For example, each of the first sheet patterns NS1 may include one of silicon or germanium as an elemental semiconductor material, a group IV-IV compound semiconductor, or a group III-V compound semiconductor. For example, each of the second sheet patterns NS2 may include one of the elemental semiconductor material, e.g., silicon or germanium, the group IV-IV compound semiconductor, or the group III-V compound semiconductor.

Each of the first sheet patterns NS1 may include the same material as that of the first lower pattern BP1, or may include a material other than that of the first lower pattern BP1. Each of the second sheet patterns NS2 may include the same material as that of the second lower pattern BP2, or may include a material other than that of the second lower pattern BP2.

In one example, the first sheet pattern NS1 and the second sheet pattern NS2 may include the same material. In another example, the first sheet pattern NS1 may include a different material than that of the second sheet pattern NS2.

In the semiconductor device according to some embodiments, each of the first lower pattern BP1 and the second lower pattern BP2 may be embodied as a silicon lower pattern including silicon, while each of the first sheet pattern NS1 and the second sheet pattern NS2 may be embodied as a silicon sheet pattern including silicon.

The first active pattern AP1 is described by way of example. A width in the second direction D2 of the first sheet pattern NS1 may be increased or decreased in proportion to a width in the second direction D2 of the first lower pattern BP1. For example, as illustrated in FIG. 2, the widths in the second direction D2 of the first sheet patterns NS1 stacked in the third direction D3 may be the same. In another example, as the distance from the first lower pattern BP1 increases, the width of the first sheet pattern NS1 stacked in the third direction D3 in the second direction D2 may decrease.

A field insulating film 105 may be formed on the substrate 100. The field insulating film 105 may be disposed on a side wall BP1_SW of the first lower pattern and a side wall BP2_SW of the second lower pattern. The field insulating film 105 may cover the side wall BP1_SW of the first lower pattern and the side wall BP2_SW of the second lower pattern. The field insulating film 105 may not be disposed on an upper surface BP1_US of the first lower pattern and an upper surface BP2_US of the second lower pattern.

In one example, as illustrated n FIG. 3, the field insulating film 105 may cover an entirety of the side wall BP1_SW of the first lower pattern and an entirety of the side wall BP2_SW of the second lower pattern. In another example, the field insulating film 105 may cover, e.g., only, a portion of the side wall BP1_SW of the first lower pattern. The field insulating film 105 may cover, e.g., only, a portion of the side wall BP2_SW of the second lower pattern. In this case, a portion of the first lower pattern BP1 and a portion of the second lower pattern BP2 may protrude beyond, e.g., above, an upper surface of the field insulating film 105 in the third direction D3.

Each of the first sheet patterns NS1 and each of the second sheet patterns NS2 may have a vertical level higher than that of the upper surface of the field insulating film 105. The field insulating film 105 may include, e.g., an oxide film, a nitride film, an oxynitride film, or a combination film thereof. Although the field insulating film 105 is shown to be embodied as a single film, this is only for convenience of description, e.g., the field insulating film 105 may include multiple films.

A plurality of gate structures GS may be disposed on the substrate 100. Each gate structure GS may extend in the second direction D2. The gate structures GS may be arranged to be spaced apart from each other in the first direction D1. The gate structures GS may be adjacent to each other in the first direction D1.

The gate structure GS may be disposed on the first active pattern AP1 and the second active pattern AP2. The gate structure GS may intersect the first active pattern AP1 and the second active pattern AP2.

The gate structure GS may intersect the first lower pattern BP1 and the second lower pattern BP2. The gate structure GS may surround each of the first sheet patterns NS1 and each of the second sheet patterns NS2. The gate structure GS may include, e.g., a gate electrode 120 and a gate insulating film 130.

Although a single, e.g., same, gate structure GS is shown to be disposed over the first active pattern AP1 and the second active pattern AP2, this is only for convenience of description. That is, the gate structure GS may be divided into first and second portions so that the first portion of the gate structure GS intersecting the first active pattern AP1 may be spaced apart from the second portion of the gate structure GS intersecting the second active pattern AP2 in the second direction D2.

The gate structure GS may include inter gate structures INT_GS1, INT_GS2, and INT_GS3 disposed between the first sheet patterns NS1 adjacent to each other in the third direction D3 and between the first lower pattern BP1 and the first sheet pattern NS1. The inter gate structures INT_GS1, INT_GS2, and INT_GS3 may be disposed between an upper surface BP1_US of the first lower pattern and a bottom surface NS1_BS of the first sheet pattern disposed at the bottommost level, and an upper surface NS1_US of the first sheet pattern and a bottom surface NS1_BS of the first sheet pattern facing toward each other in the third direction D3.

The number of inter gate structures INT_GS1, INT_GS2, and INT_GS3 may be proportional to the number of the first sheet patterns NS1 included in the first active pattern AP. For example, the number of the inter gate structures INT_GS1, INT_GS2, and INT_GS3 may be the same as the number of the first sheet patterns NS1. Because the first active pattern AP1 includes a plurality of the first sheet patterns NS1, the gate structure GS may include a plurality of the inter gate structures INT_GS1, INT_GS2, and INT_GS3.

In the semiconductor device according to some embodiments, the inter gate structures INT_GS1, INT_GS2, and INT_GS3 may be in contact with the first source/drain pattern 150 to be described later. For example, the inter gate structures INT_GS1, INT_GS2, and INT_GS3 may be in direct contact with the first source/drain pattern 150. The inter gate structures INT_GS1, INT_GS2, and INT_GS3 contact the upper surface BP1_US of the first lower pattern, the upper surface NS1_US of the first sheet pattern, and the bottom surface NS1_BS of the first sheet pattern. The following description is made based on a case where the number of inter gate structures INT_GS1, INT_GS2, and INT_GS3 is three.

In detail, the gate structure GS may include a first inter gate structure INT_GS1, a second inter gate structure INT_GS2, and a third inter gate structure INT_GS3. The first inter gate structure INT_GS1, the second inter gate structure INT_GS2, and the third inter gate structure INT_GS3 may be sequentially arranged on the first lower pattern BP1 in the third direction D3.

The third inter gate structure INT_GS3 may be disposed between the first lower pattern BP1 and the first sheet pattern NS1. The third inter gate structure INT_GS3 among the inter gate structures INT_GS1, INT_GS2, and INT_GS3 may be disposed at the bottommost level. The third inter gate structure INT_GS3 may be in contact with the upper surface BP1_US of the first lower pattern.

Each of the first inter gate structure INT_GS1 and the second inter gate structure INT_GS2 may be disposed between the first sheet patterns NS1 adjacent to each other in the third direction D3. The first inter gate structure INT_GS1 among the inter gate structures INT_GS1, INT_GS2, and INT_GS3 may be disposed at the topmost level. The first inter gate structure INT_GS1 may be in contact with the bottom surface NS1_BS of the first sheet pattern disposed at the topmost level. The second inter gate structure INT_GS2 may be disposed between the first inter gate structure INT_GS1 and the third inter gate structure INT_GS3.

Each of the inter gate structures INT_GS1, INT_GS2, and INT_GS3 may include the gate electrode 120 and the gate insulating film 130 disposed between the adjacent first sheet patterns NS1 and between the first lower pattern BP1 and the first sheet pattern NS1.

In the semiconductor device according to some embodiments, a width W1 in the first direction D1 of the first inter gate structure INT_GS1 may be the same as a width W2 in the first direction D1 of the second inter gate structure INT_GS2. Widths of the inter gate structures INT_GS1 and INT_GS2 disposed between the sheet patterns NS adjacent to each other in the third direction D3 may be equal to each other.

For example, as illustrated in FIG. 2, a width W3 in the first direction D1 of the third inter gate structure INT_GS3 may be greater than the width W2 in the first direction D1 of the second inter gate structure INT_GS2. In another example, the width W3 in the first direction D1 of the third inter gate structure INT_GS3 may be the same as the width W2 in the first direction D1 of the second inter gate structure INT_GS2.

The second inter gate structure INT_GS2 is described by way of example. The width W2 of the second inter gate structure INT_GS2 between the upper surface NS1_US of the first sheet pattern and the bottom surface NS1_BS of the second sheet pattern facing toward each other in the third direction D3 may be measured.

The above descriptions of the relationship between the first active pattern AP1 and the gate structure GS may be equally applied to a relationship between the second active pattern AP2 and the gate structure GS.

The gate electrode 120 may be formed on the first lower pattern BP1 and the second lower pattern BP2. The gate electrode 120 may intersect the first lower pattern BP1 and the second lower pattern BP2. The gate electrode 120 may surround the first sheet pattern NS1 and the second sheet pattern NS2.

The first active pattern AP1 among the first and second active patterns AP1 and AP2 is described by way of example. A portion of the gate electrode 120 may be disposed between the adjacent first sheet patterns NS1 and between the first lower pattern BP1 and the first sheet pattern NS1. When the first sheet pattern NS1 includes a first sub-sheet pattern and a second sub-sheet pattern adjacent to each other in the third direction D3, a portion of the gate electrode 120 may be disposed between an upper surface NS1_US of the first sub-sheet pattern and a bottom surface NS1_BS of the second sub-sheet pattern facing toward each other. Further, a portion of the gate electrode 120 may be disposed between the upper surface BS1_US of the first lower pattern and the bottom surface NS1_BS of the first sheet pattern disposed at the bottommost level. The first sub-sheet pattern may be the first sheet pattern NS1 disposed at the bottommost level, or may not be the first sheet pattern NS1 disposed at the bottommost level.

The gate electrode 120 may include at least one of a metal, a metal alloy, a conductive metal nitride, a metal silicide, a doped semiconductor material, a conductive metal oxide, and a conductive metal oxynitride. The gate electrode 120 may include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof.

The conductive metal oxide and the conductive metal oxynitride may include oxidized products of the above-mentioned materials.

The gate electrode 120 may be disposed on each of both opposing sides of the first source/drain pattern 150 to be described later. The gate structure GS may be disposed on each of both opposing sides opposite to each other in the first direction D1 of the first source/drain pattern 150.

In one example, each of the gate electrodes 120 disposed on each of both opposing sides of the first source/drain pattern 150 may be embodied as a normal gate electrode used as a gate of a transistor. In another example, the gate electrode 120 disposed on one side of the first source/drain pattern 150 may be used as a gate of the transistor, while the gate electrode 120 disposed on the other side of the first source/drain pattern 150 may act as a dummy gate electrode.

The above description of the relationship between the first source/drain pattern 150 and the gate electrode 120 may be equally applied to that between the second source/drain pattern 250 and the gate electrode 120.

The gate insulating film 130 may extend along an upper surface of the field insulating film 105, an upper surface BP1_US of the first lower pattern, and an upper surface BP2_US of the second lower pattern. The gate insulating film 130 may surround the first sheet pattern NS1 and the second sheet pattern NS2. The gate insulating film 130 may extend along a circumference of the first sheet pattern NS1 and a circumference of the second sheet pattern NS2. The gate electrode 120 is disposed on the gate insulating film 130.

Description based on the first active pattern AP1 is made by way of example. A portion of the gate insulating film 130 may be disposed between the first sheet patterns NS1 adjacent to each other in the third direction D3 and between the first lower pattern BP1 and the first sheet pattern NS1. When the first sheet pattern NS1 includes the first sub-sheet pattern and the second sub-sheet pattern adjacent to each other, a portion of the gate insulating film 130 may extend along the upper surface NS1_US of the first sub-sheet pattern and the bottom surface NS1_BS of the second sub-sheet pattern facing toward each other.

Although the gate insulating film 130 is shown to be embodied as a single film, the present disclosure is not limited thereto, e.g., the gate insulating film 130 may include an interfacial insulating film and a high dielectric constant insulating film. The interfacial insulating film may be disposed between the high dielectric constant insulating film and each of the sheet patterns NS1 and NS2.

The gate insulating film 130 may include silicon oxide, silicon oxynitride, silicon nitride, or a high dielectric constant material having a dielectric constant greater than that of silicon oxide. The high dielectric constant material may include at least one of, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include an NC (negative capacitance) FET using a negative capacitor. For example, the gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors are connected in series to each other, and the capacitance of each of the capacitors has a positive value, the total capacitance is smaller than the capacitance of each individual capacitor. On the contrary, when at least one of the capacitances of two or more capacitors connected in series to each other has a negative value, the total capacitance may have a positive value and may be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, e.g., at least one of gadolinium (Gd), silicon (Si), zirconium (Zr), aluminum (Al), and yttrium (Y).

When the dopant is aluminum (Al), the ferroelectric material film may contain about 3 at % (atomic %) to about 8 at % of aluminum. In this connection, a content of the dopant may be a content of aluminum based on a sum of hafnium and aluminum.

When the dopant is silicon (Si), the ferroelectric material film may contain about 2 at % to about 10 at % of silicon. When the dopant is yttrium (Y), the ferroelectric material film may contain about 2 at % to about 10 at % yttrium. When the dopant is gadolinium (Gd), the ferroelectric material film may contain about 1 at % to about 7 at % gadolinium. When the dopant is zirconium (Zr), the ferroelectric material film may contain about 50 at % to about 80 at % zirconium.

The paraelectric material film may have paraelectric properties. The paraelectric material film may include, e.g., at least one of silicon oxide and metal oxide having a high dielectric constant. Although the metal oxide contained in the paraelectric material film may include, e.g., at least one of hafnium oxide, zirconium oxide and aluminum oxide.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. For example, the thickness of the ferroelectric material film may be in a range of about 0.5 nm to about 10 nm. However, because a critical thickness exhibiting the ferroelectric properties may vary based on a type of the ferroelectric material, the thickness of the ferroelectric material film may vary depending on the type of the ferroelectric material.

In one example, the gate insulating film 130 may include one ferroelectric material film. In another example, the gate insulating film 130 may include a plurality of ferroelectric material films spaced apart from each other. The gate insulating film 130 may have a stack structure in which a plurality of ferroelectric material films and a plurality of paraelectric material films are alternately stacked with each other.

A gate capping pattern 145 may be disposed on the gate structure GS. The gate capping pattern 145 may extend along the upper surface GS_US of the gate structure. The gate capping pattern 145 may include, e.g., at least one of silicon oxide ($SiO_2$), silicon nitride (SiN), silicon oxynitride (SiON), silicon carbonitride (SiCN), silicon oxycarbonitride (SiOCN), silicon oxycarbide (SiOC), and combinations thereof.

The gate etching stop pattern 125 may be disposed on the gate structure GS. The gate etching stop pattern 125 may be disposed between the gate structure GS and the gate capping pattern 145. The gate capping pattern 145 may be disposed on the gate structure GS and the gate etching stop pattern 125.

The gate etching stop pattern 125 may include an upper surface 125_US and a bottom surface 125_BS. The upper surface 125_US of the gate etching stop pattern is opposite to the bottom surface 125_BS of the gate etching stop pattern in the third direction D3.

The upper surface 125_US of the gate etching stop pattern may face toward the gate capping pattern 145. The bottom surface 125_BS of the gate etching stop pattern may face toward the gate structure GS.

The bottom surface 125_BS of the gate etching stop pattern may, e.g., directly, contact the upper surface GS_US of the gate structure GS. The upper surface 125_US of the gate etching stop pattern may, e.g., directly, contact the gate capping pattern 145.

The gate etching stop pattern 125 may overlap the first active pattern AP1 and the second active pattern AP2 in the third direction D3, e.g., in a top view. For example, the gate etching stop pattern 125 may overlap the first sheet pattern NS1 and the second sheet pattern NS2 in the third direction D3, e.g., in a top view. For example, the gate etching stop pattern 125 and a top surface of the first lower pattern BP1 may completely overlap each other in the third direction D3, e.g., so the gate etching stop pattern 125 may not extend beyond the top surface of the first lower pattern BP1.

The gate etching stop pattern 125 does not overlap with the field insulating film 105 in the third direction D3. The gate etching stop pattern 125 does not overlap the upper surface of the field insulating film 105 in the third direction D3.

In other words, when one gate structure GS intersects a plurality of active patterns, the number of gate etching stop patterns 125 disposed on the upper surface GS_US of the gate structure may be the same as the number of the active patterns. The gate etching stop patterns 125 disposed on the upper surface GS_US of the gate structure may be arranged to be spaced apart from each other in the second direction D2.

In FIG. 2, in an area where the gate structure GS overlaps the first sheet pattern NS1, a vertical dimension, e.g., a vertical distance, from the upper surface BP1_US of the first lower pattern to the upper surface GS_US of the gate structure GS may be a first vertical dimension H1. In FIG. 3, in an area where the gate structure GS overlaps the field insulating film 105, a vertical dimension from the upper surface BP1_US of the first lower pattern to the upper surface GS_US of the gate structure may be a second vertical dimension H2. In the semiconductor device according to some embodiments, the first vertical dimension H1 is greater than the second vertical dimension H2.

A vertical dimension from the upper surface BP2_US of the second lower pattern to the upper surface GS_US of the gate structure GS in an area where the gate structure GS overlaps the second sheet pattern NS2 is larger than the second vertical dimension H2.

When the upper surface GS_US of the gate structure includes a concavely curved surface, the second vertical dimension H2 in the area where the gate structure GS overlaps the field insulating film 105 may be a vertical dimension from the upper surface GS_US of the gate structure GS to the bottommost level of the gate structure GS.

Description is made based on the first active pattern AP1 by way of example. A portion of the gate structure GS may be disposed between the first sheet pattern NS1 disposed at the topmost level and the gate etching stop pattern 125, e.g., a portion of the gate structure GS may be directly between the topmost first sheet pattern NS1 and the gate etching stop pattern 125. The gate insulating film 130 may extend along the bottom surface 125_BS of the gate etching stop pattern 125, e.g., the bottom surface 125_BS of the gate etching stop pattern 125 may directly contact a portion of the gate insulating film 130 on a topmost surface of the gate electrode 120.

The gate etching stop pattern 125 may include, e.g., an insulating material. The gate etching stop pattern 125 may include, e.g., at least one of silicon oxide ($SiO_2$), silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and combinations thereof.

A gate spacer 140 may be disposed on a side wall 145_SW of the gate capping pattern 145. The gate spacer 140 may extend along the side wall 145_SW of the gate capping pattern 145.

In an area where the gate structure GS overlaps the field insulating film 105, the gate spacer 140 may be disposed on the side wall of the gate structure GS. In the semiconductor device according to some embodiments, the gate spacer 140 may not be disposed between the first lower pattern BP1 and the first sheet pattern NS1 and between the first sheet patterns NS1 adjacent to each other in the third direction D3.

An upper surface 140_US of the gate spacer 140 may be coplanar with an upper surface 145_US of the gate capping pattern 145. In FIG. 2, a vertical level of each of the upper surface 140_US of the gate spacer 140 and the upper surface 145_US of the gate capping pattern 145 is higher than that of the upper surface 125_US of the gate etching stop pattern 125.

The gate spacer 140 may include, e.g., at least one of silicon nitride (SiN), silicon oxynitride (SiON), silicon oxide $(SiO_2)$, silicon oxycarbonitride (SiOCN), silicon boron nitride (SiBN), silicon oxyboron nitride (SiOBN), silicon oxycarbide (SiOC), and combinations thereof. Although the gate spacer 140 is shown as a single film, this is only for convenience of description, e.g., the gate spacer 140 may include multiple films.

The first source/drain pattern 150 may be disposed on the first active pattern AP1. The second source/drain pattern 250 may be disposed on the second active pattern AP2. Descriptions of the second source/drain pattern 250 are to the descriptions of the first source/drain pattern 150, and therefore, only descriptions of the first source/drain pattern 150 will be made below.

The first source/drain pattern 150 may be disposed on the first lower pattern BP. The first source/drain pattern 150 is connected to the first sheet pattern NS1. The first source/drain pattern 150, e.g., directly, contacts the first sheet pattern NS1. The first source/drain pattern 150 may connect the first sheet patterns NS1 spaced apart from each other in the first direction D1 to each other.

The first source/drain pattern 150 may be disposed on at least one side of the gate structure GS. The first source/drain pattern 150 may be disposed between gate structures GS adjacent to each other in the first direction D1. For example, the first source/drain pattern 150 may be disposed on each of both opposing sides of the gate structure GS. In another example, the first source/drain pattern 150 may be disposed on one side of the gate structure GS, and may not be disposed on the other side of the gate structure GS.

The first source/drain pattern 150 may be included in a source/drain of a transistor using the first sheet pattern NS as a channel area. The first source/drain pattern 150 may be received in a source/drain recess 150R. The source/drain recess 150R extends in the third direction D3. The source/drain recess 150R may be defined between gate structures GS adjacent to each other in the first direction D1.

For example, a bottom surface of the source/drain recess 150R may be defined by the first lower pattern BP1. A side wall of the source/drain recess 150R may be defined by the first sheet pattern NS1 and the inter gate structures INT_GS1, INT_GS2, and INT_GS3. A portion of the side wall of the source/drain recess 150R may be defined by the gate structure GS between the first sheet pattern NS1 disposed at the topmost level and the gate etching stop pattern 125. In the semiconductor device according to some embodiments, side walls of the inter gate structures INT_GS1, INT_GS2, and INT_GS3 may be defined by the gate insulating film 130 of the inter gate structures INT_GS1 INT_GS2, and INT_GS3.

In an area between the first nanosheet NS1 disposed at the bottommost level and the first lower pattern BP1, a boundary between the gate insulating film 130 and the first lower pattern BP1 may be the upper surface BP1_US of the first lower pattern. In other words, the upper surface BP1_US of the first lower pattern may be a boundary between the third inter gate structure INT_GS3 disposed at the bottommost level and the first lower pattern BP1. A vertical level of the bottom surface of the source/drain recess 150R is lower than that of the upper surface BP1_US of the first lower pattern.

The first source/drain pattern 150 may be received in the source/drain recess 150R. The first source/drain pattern 150 may fill the source/drain recess 150R.

The first source/drain pattern 150 may contact the first sheet pattern NS and the first lower pattern BP. The inter gate structures INT_GS1, INT_GS2, and INT_GS3 may be in contact with the first source/drain pattern 150. A portion of the gate structure GS between the first sheet pattern NS1 disposed at the topmost level and the gate etching stop pattern 125 may contact the first source/drain pattern 150.

The first source/drain pattern 150 may include an epitaxial pattern. The first source/drain pattern 150 may include a semiconductor material.

The first source/drain pattern 150 may include, e.g., silicon or germanium as an elemental semiconductor material. Further, the first source/drain pattern 150 may include, e.g., a binary compound including two of carbon (C), silicon (Si), germanium (Ge), and tin (Sn), a ternary compound including three thereof, or the binary compound or the ternary compound containing a group IV element doped thereto. For example, the first source/drain pattern 150 may include silicon, silicon-germanium, germanium, silicon carbide, etc.

The first source/drain pattern 150 may include impurities doped into the semiconductor material. The doped impurities may include at least one of, e.g., boron (B), phosphorus (P), carbon (C), arsenic (As), antimony (Sb), bismuth (Bi), and oxygen (O). The first source/drain pattern 150 may be a single film or a stack of a plurality of films.

The upper surface 150_US of the first source/drain pattern 150 may be coplanar with the upper surface GS_US of the gate structure GS. Alternatively, a vertical level of the upper surface 150_US of the first source/drain pattern 150 may be higher than that of the upper surface GS_US of the gate structure GS.

The vertical dimension H3 from the upper surface BP1_US of the first lower pattern to the upper surface 150_US of the first source/drain pattern 150 may be the same as or greater than the vertical dimension H1 from the upper surface BP1_US of the first lower pattern to the upper surface GS_US of the gate structure GS. In another example, the vertical dimension H3 from the upper surface BP1_US of the first lower pattern to the upper surface 150_US of the first source/drain pattern 150 may be smaller than the vertical dimension H1 from the upper surface BP1_US of the first lower pattern to the upper surface GS_US of the gate structure GS.

The etching stop film 185 may extend along an outer side wall of the gate spacer 140, an upper surface of the field insulating film 105, and a profile of the source/drain pattern 150. The etching stop film 185 may include a material having an etching selectivity ratio with respect to an inter-layer insulating film 190 to be described later. The etching stop film 185 may include, e.g., at least one of silicon nitride (SiN), silicon oxide $(SiO_2)$, silicon oxynitride (SiON), silicon oxycarbonitride (SiOCN), silicon boron nitride (SiBN), silicon oxyboron nitride (SiOBN), silicon oxycarbide (SiOC), and combinations thereof.

The interlayer insulating film 190 may be disposed on the etching stop film 185. The interlayer insulating film 190 may be disposed on the first source/drain pattern 150. The interlayer insulating film 190 may not cover the upper surface 145_US of the gate capping pattern 45 and the upper surface 140_US of the gate spacer 140. For example, the upper surface of the interlayer insulating film 190 may be coplanar with the upper surface 145_US of the gate capping pattern 145 and the upper surface 140_US of the gate spacer 140.

The interlayer insulating film 190 may include, e.g., at least one of silicon oxide, silicon nitride, silicon oxynitride, and a low dielectric constant (low-k) material. The low dielectric constant material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), TOSZ (Tonen SilaZen), FSG (fluoride silicate glass), polyimide nanofoams, e.g., polypropylene oxide, CDO (carbon doped silicon oxide), OSG (organo silicate glass), SiLK, amorphous fluorinated carbon, silica aerogels, silica xerogels, mesoporous silica, or a combination thereof.

The gate contact 170 may be disposed on the gate electrode 120. The gate contact 170 may extend through a space between the gate spacers 140 respectively disposed on both opposing sides of the gate capping pattern 145.

The gate contact 170 may extend through the gate capping pattern 145. The gate contact 170 may be connected to the gate electrode 120.

In the semiconductor device according to some embodiments, the gate contact 170 may be connected to the gate electrode 120 in an area in which the gate structure GS overlaps the first sheet pattern NS1. The gate contact 170 may extend through the gate etching stop pattern 125.

An upper surface 170_US of the gate contact 170 may be coplanar with the upper surface 140_US of the gate spacer 140. The upper surface 170_US of the gate contact 170 may be coplanar with the upper surface 145_US of the gate capping pattern 145.

The source/drain contact 175 may be disposed on the first source/drain pattern 150. The source/drain contact 175 may extend through the interlayer insulating film 190 and the etching stop film 185. The source/drain contact 175 may be connected to the first source/drain pattern 150. The source/drain contact 175 may be disposed on a second source/drain pattern 250 and may be connected to the second source/drain pattern 250.

A silicide film may be disposed between the source/drain contact 175 and each of the source/drain patterns 150 and 250. The silicide film may include, e.g., a metal silicide material.

An upper surface 175_US of the source/drain contact 175 may be coplanar with the upper surface 140_US of the gate spacer 140. The upper surface 175_US of the source/drain contact 175 may be coplanar with the upper surface 145_US of the gate capping pattern 145. The upper surface 175_US of the source/drain contact 175 may be coplanar with the upper surface 170_US of the gate contact 170.

Each of the gate contact 170 and the source/drain contact 175 may include a conductive material, e.g., at least one of metal, metal nitride, metal carbonitride, two-dimensional material, and conductive semiconductor material. Each of the gate contact 170 and the source/drain contact 175 may be a single film or a stack of multiple films, e.g., at least one of the gate contact 170 and the source/drain contact 175 may include a contact barrier film and a contact filling film filling a space defined by the contact barrier film.

In one example, a diagram cut along the second active pattern AP2 except for the gate contact 170 and the source/drain contact 175 in the first direction D1 may be similar to FIG. 2. In another example, a diagram cut along the second active pattern AP2 except for the gate contact 170 and the source/drain contact 175 in the first direction D1 may be similar to FIG. 9 to be described later.

Figure 5:
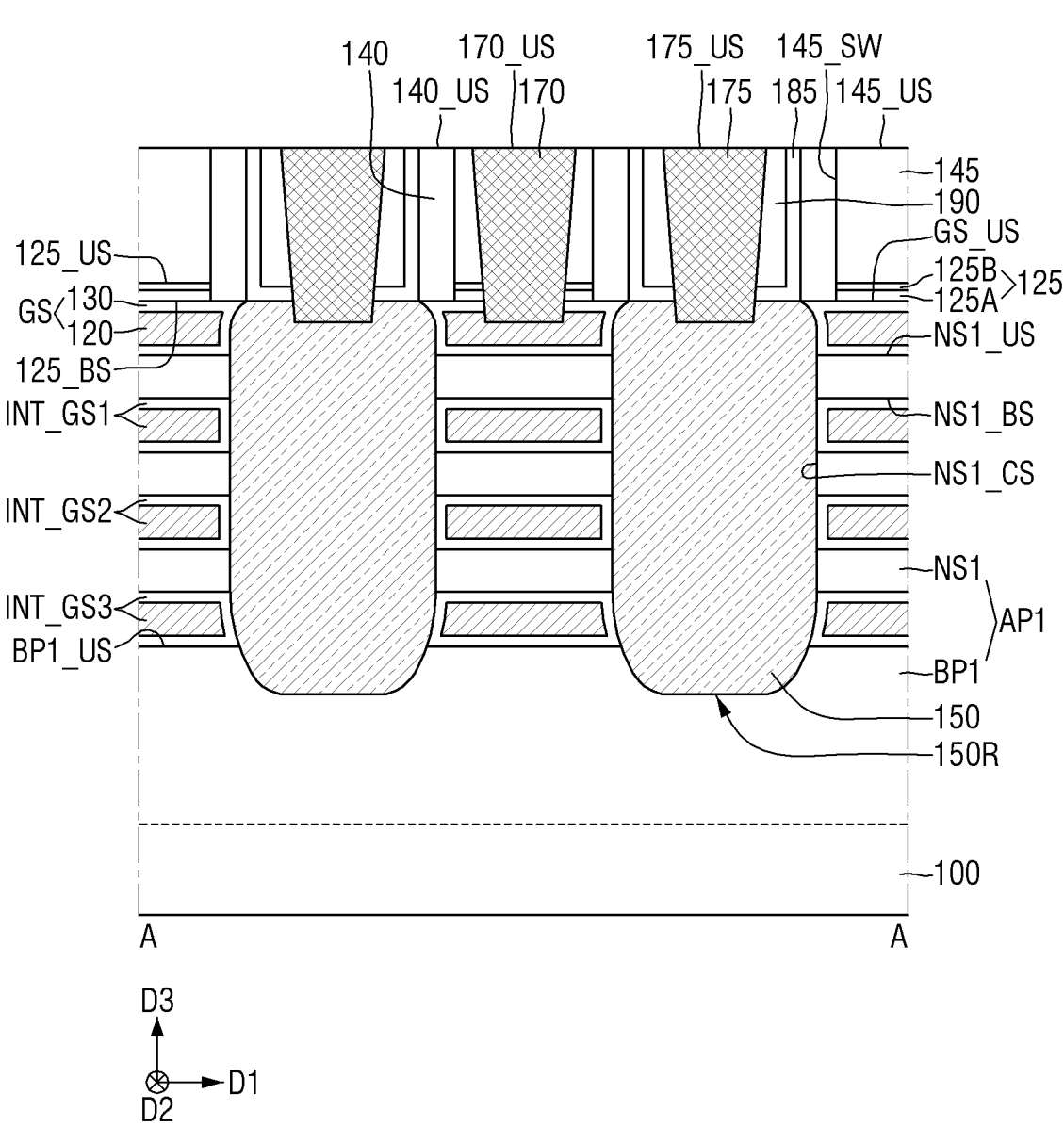
FIG. 5 is a view of the semiconductor device according to some embodiments.
Figure 6:
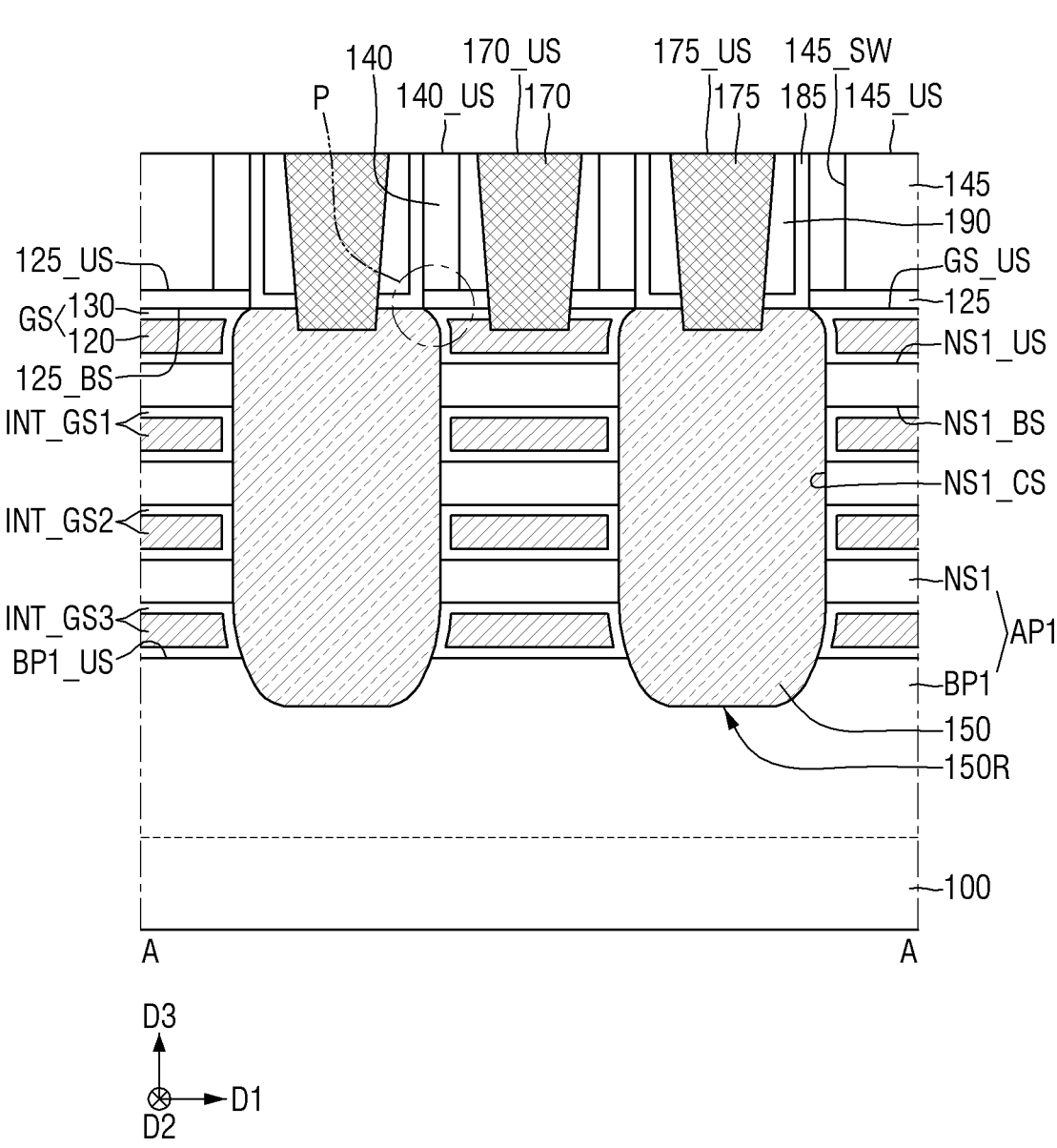
Figure 7:
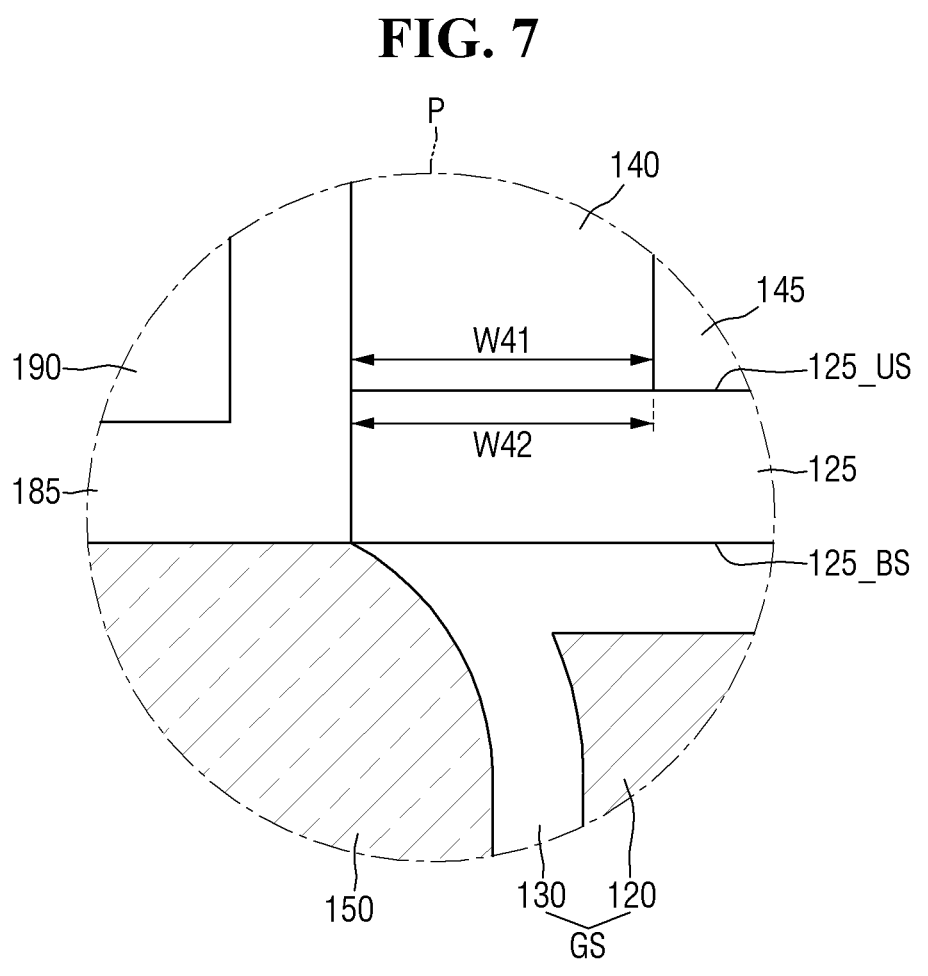
Figure 8:
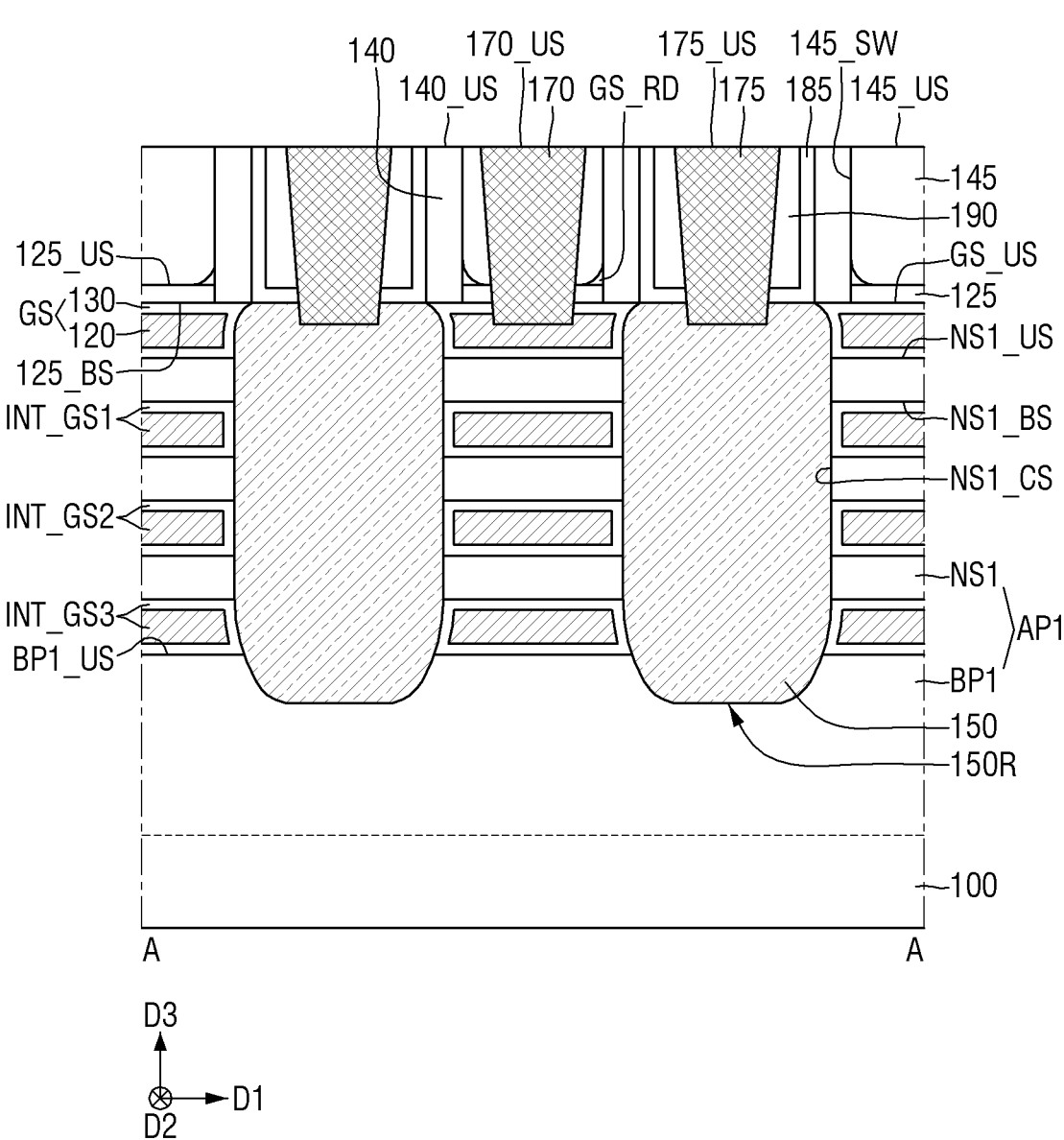
FIG. 8 is a view of the semiconductor device according to some embodiments.

FIG. 5 is a diagram of a semiconductor device according to some embodiments. FIGS. 6 and 7 are diagrams of a semiconductor device according to some embodiments. FIG. 8 is a diagram of a semiconductor device according to some embodiments. For convenience of description, following descriptions are based on differences relative to the embodiment of FIG. 1 to FIG. 4. For reference, FIG. 7 is an enlarged view of a portion P in FIG. 6.

Referring to FIG. 5, in a semiconductor device according to some embodiments, the gate etching stop pattern 125 may include a plurality of etching stop patterns 125A and 125B. The gate etching stop pattern 125 may include a lower etching stop pattern 125A and an upper etching stop pattern 125B. The upper etching stop pattern 125B may be disposed between the lower etching stop pattern 125A and the gate capping pattern 145. The lower etching stop pattern 125A and the upper etching stop pattern 125B may include different materials.

Referring to FIGS. 6 and 7, in a semiconductor device according to some embodiments, a portion of the gate etching stop pattern 125 may be inserted in a space between the gate spacer 140 and the gate structure GS. The gate spacer 140 may contact the upper surface 125_US of the gate etching stop pattern.

At a boundary between the gate spacer 140 and the gate etching stop pattern 125, a width in the first direction D1 of the gate spacer 140 may be a first width W41. A width by which the upper surface 125_US of the gate etching stop pattern and the gate spacer 140 contact each other may be a second width W42. That is, the upper surface 125_US of the gate etching stop pattern may contact the gate spacer 140 by the second width W42 in the first direction D1.

In one example, the first width W41 may be equal to the second width W42. In another example, the first width W41 may be greater than the second width W42.

Referring to FIG. 8, a semiconductor device according to some embodiments may further include a gate residue GS_RD disposed on the upper surface 125_US of the gate etching stop pattern 125. The gate residue GS_RD may be disposed in an area where the side wall of the gate spacer 140 and the upper surface 125_US of the gate etching stop pattern 125 meet each other.

In one example, the gate residue GS_RD may include the same material as that of the gate insulating film 130. In another example, the gate residue GS_RD may include a material included in the gate insulating film 130 and a material included in the gate electrode 120.

Figure 9:
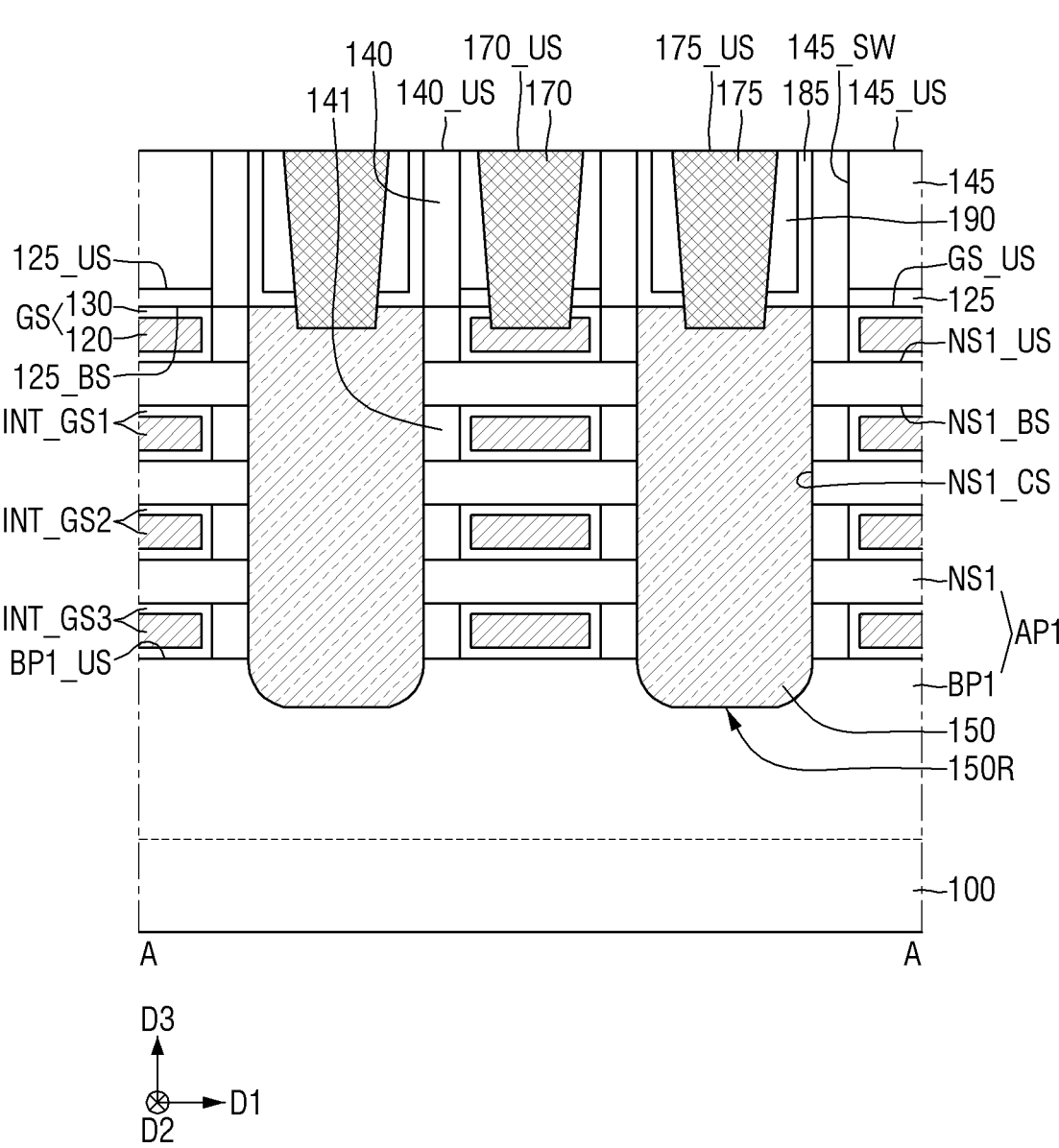
FIG. 9 is a view of the semiconductor device according to some embodiments.
Figure 10:
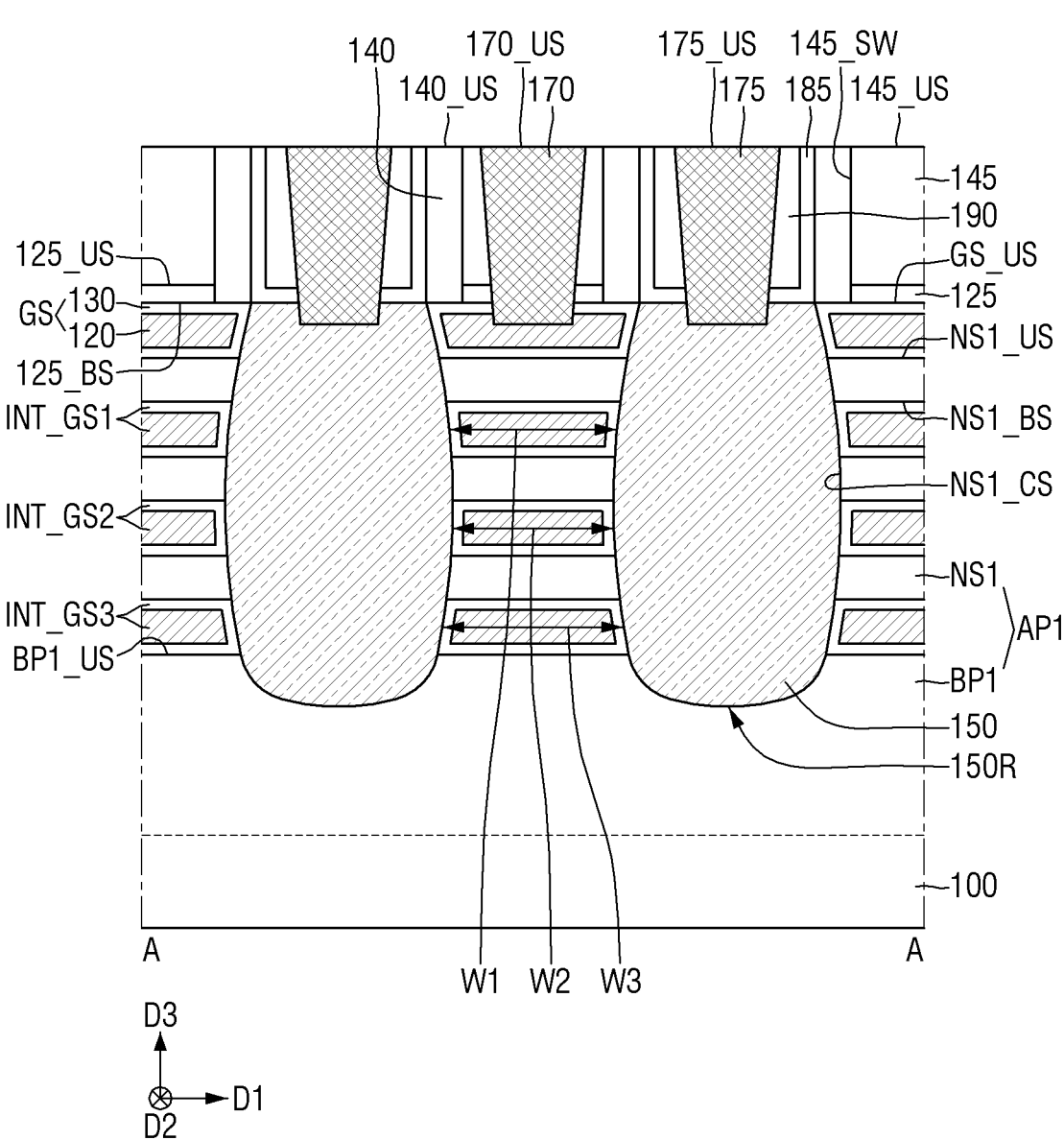
FIG. 10 is a view of the semiconductor device according to some embodiments.

FIG. 9 is a diagram of a semiconductor device according to some embodiments. FIG. 10 is a diagram of a semiconductor device according to some embodiments. For convenience of description, following descriptions are based on differences relative to the embodiment of FIG. 1 to FIG. 4.

Referring to FIG. 9, a semiconductor device according to some embodiments may further include an inner spacer 141 disposed between the gate structure GS and the first source/drain pattern 150. The inner spacer 141 may be disposed between the inter gate structures INT_GS1, INT_GS2, and INT_GS3, and the first source/drain pattern 150. A side wall of the source/drain recess 150R may be defined by the inner spacer 141.

The inner spacer 141 may contact a portion of the gate structure GS between the first sheet pattern NS1 disposed at the topmost level and the gate etching stop pattern 125. The inner spacer 141 may contact the inter gate structures INT_GS1, INT_GS2, and INT_GS3. The inner spacer 141 may contact the first source/drain pattern 150. The inner spacer 141 may include, e.g., at least one of silicon nitride SiN, silicon oxynitride (SiON), silicon oxide ($SiO_2$), silicon oxycarbonitride (SiOCN), silicon boron nitride (San), silicon oxyboron nitride (SiOBN), silicon oxycarbide (SiOC), and combinations thereof.

Referring to FIG. 10, in a semiconductor device according to some embodiments, widths of the inter gate structures INT_GS1 and INT_GS2 respectively disposed between the first sheet patterns NS1 adjacent to each other in the third direction D3 may be different from each other. For example, a width W1 in the first direction D1 of the first inter gate structure INT_GS1 may be greater than a width W2 in the first direction D1 of the second inter gate structure INT_GS2, and the width W2 in the first direction D1 of the second inter gate structure INT_GS2 may be smaller than a width W3 in the first direction D1 of the third inter gate structure INT_GS2.

Figure 11:
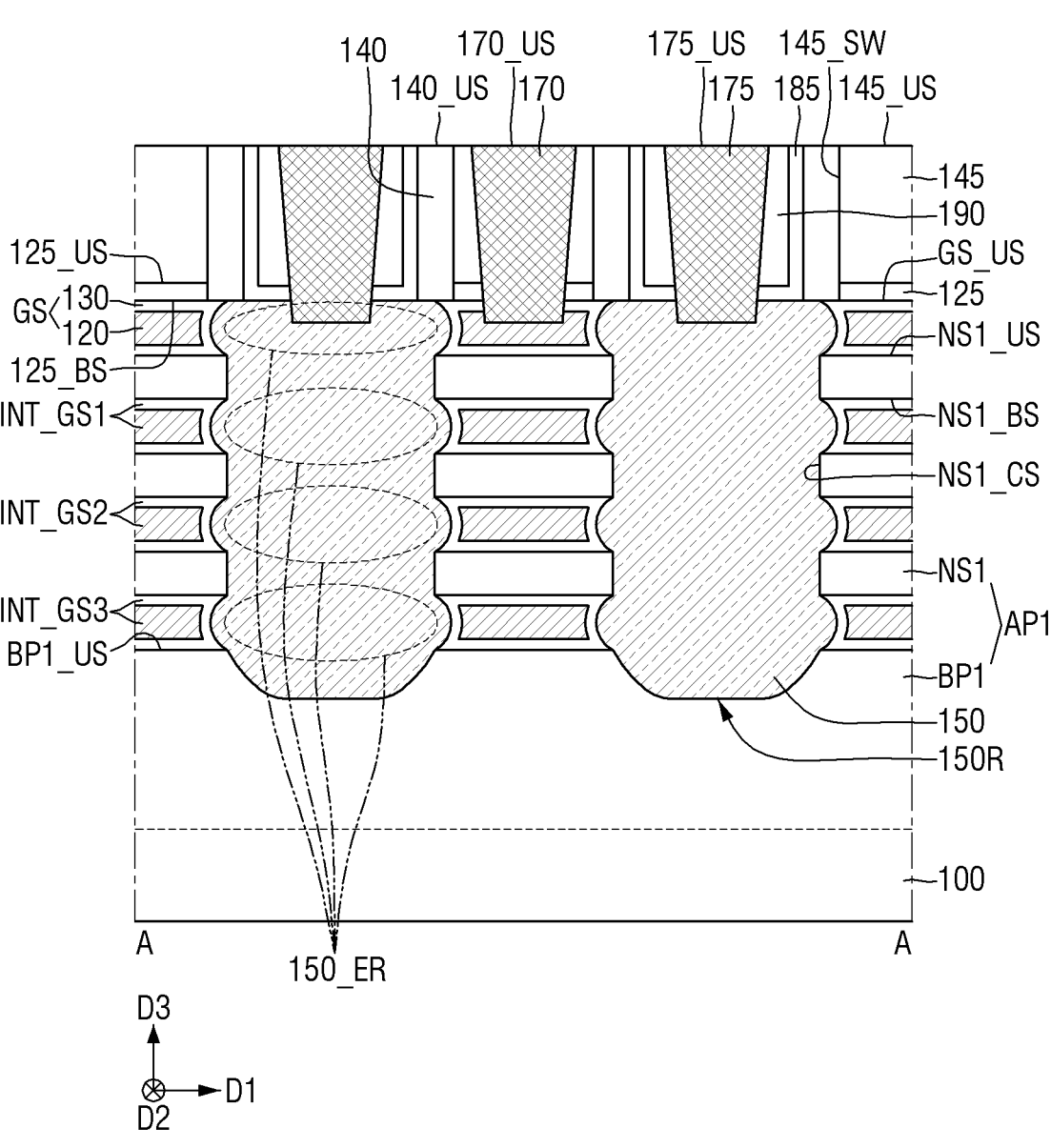
FIG. 11 is a view of the semiconductor device according to some embodiments.

FIG. 11 is a diagram of a semiconductor device according to some embodiments. For convenience of description, the following descriptions are based on differences relative to the embodiment of FIG. 1 to FIG. 4.

Referring to FIG. 11, in a semiconductor device according to some embodiments, the first source/drain pattern 150 may include a plurality of width extension areas 150_ER. A side wall of the first source/drain pattern 150 may have a wavy shape.

The width extension area 150_ER of each of the first source/drain patterns may be defined above the upper surface BP1_US of the first lower pattern. The width extension area 150_ER of the first source/drain pattern may be defined between nanosheets NS adjacent to each other in the third direction D3. The width extension area 150_ER of the first source/drain pattern may be defined between the first lower pattern BP1 and the first nanosheet NS1. The width extension area 150_ER of the first source/drain pattern may be defined between the gate etching stop pattern 125 and the first sheet pattern NS1. The width extension area 150_ER of the first source/drain pattern may extend between the first nanosheets NS adjacent to each other in the third direction D3.

In other words, the width extension area 150_ER of the first source/drain pattern may be disposed between the first nanosheets NS1 and may be defined between the inter gate structures INT_GS1 and INT_GS2 adjacent to each other in the first direction D1. The width extension area 150_ER of the first source/drain pattern may be disposed between the first nanosheet NS1 and the first lower pattern BP1, and may be defined between the third inter gate structures INT_GS3 adjacent to each other in the first direction D1.

Each of the width extension areas 150_ER of the first source/drain pattern may include a first portion whose width in the first direction D1 increases as the first portion extends away from the upper surface BP1_US of the lower pattern and a second portion whose width in the first direction D1 decreases as the first portion extends away from the upper surface BP1_US of the lower pattern. For example, a width in the first direction D1 of the width extension area 150_ER of the first source/drain pattern may increase and then decrease as the width extension area extends away from the upper surface BP1_US of the lower pattern.

A position in each of the width extension area 150_ER of the first source/drain pattern at which the width of the width extension area 150_ER of the first source/drain pattern is maximum may be located between the first nanosheet NS1 and the first lower pattern BP, or between the first nanosheets NS1 adjacent to each other in the third direction D3. Alternatively, a position in each of the width extension area 150_ER of the first source/drain pattern at which the width of the width extension area 150_ER of the first source/drain pattern is maximum may be located between the first sheet pattern NS1 disposed at the topmost level and the gate etching stop pattern 125.

A side wall of each of the inter gate structures INT_GS1, INT_GS2, and INT_GS3 contacting the first source/drain pattern 150 may have a concavely curved surface.

Figure 12:
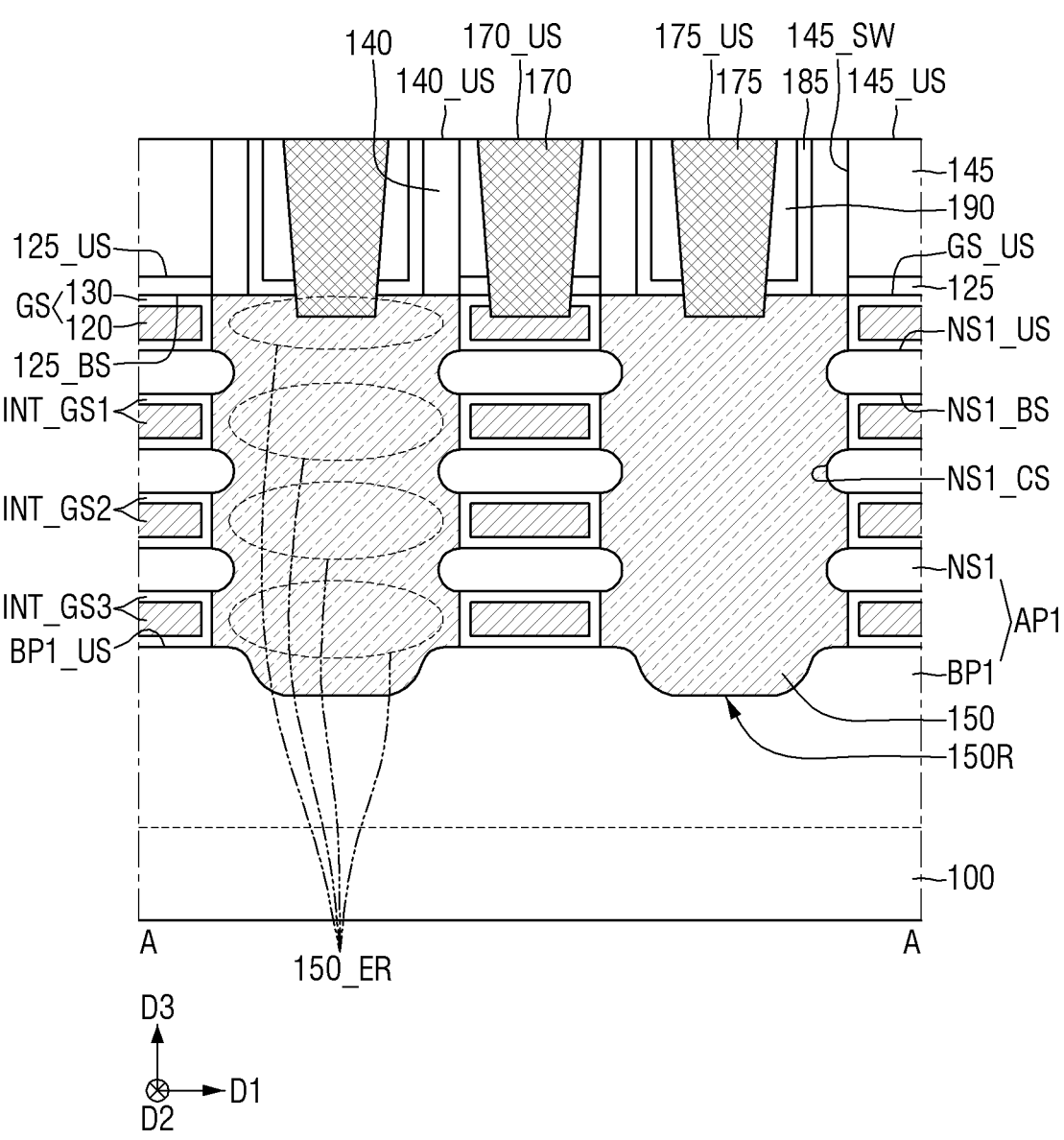
FIG. 12 is a view of the semiconductor device according to some embodiments.
Figure 13:
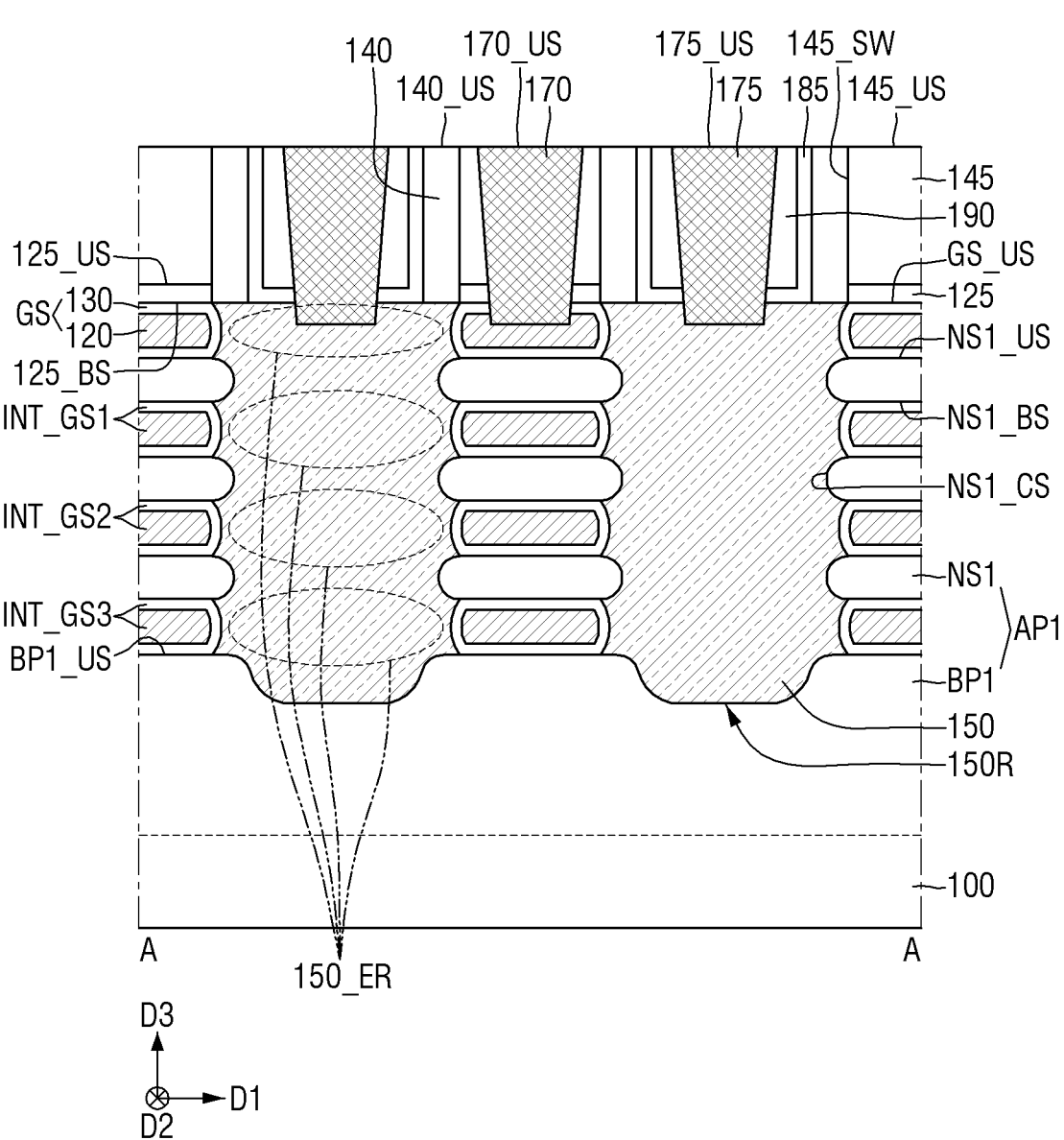
FIG. 13 is a view of the semiconductor device according to some embodiments.

FIG. 12 is a diagram of a semiconductor device according to some embodiments. FIG. 13 is a diagram of a semiconductor device according to some embodiments. For convenience of description, following descriptions are based on differences relative to the embodiment of FIG. 11.

Referring to FIG. 12, in a semiconductor device according to some embodiments, a side wall of each of the inter gate structures INT_GS1, INT_GS2, and INT_GS3 contacting the first source/drain pattern 150 may be flat. A side wall of a portion of the gate structure GS disposed between the first sheet pattern NS1 disposed at the topmost level and the gate etching stop pattern 125 and contacting the first source/drain pattern 150 may be flat. In a cross-sectional view cut along the first direction D1 in which the first lower pattern BP1 extends, a boundary between each of the inter gate structures INT_GS1, INT_GS2, and INT_GS3 and the first source/drain pattern 150 may be flat.

A width of the width extension area 150_ER of the first source/drain pattern may increase and then may be kept constant as the width extension area extends away from the upper surface BP1_US of the first lower pattern. Further, the width of the width extension area 150_ER of the first source/drain pattern may be kept constant and then may decrease as the width extension area extends away from the upper surface BP1_US of the first lower pattern.

Referring to FIG. 13, in a semiconductor device according to some embodiments, a side wall of each of the inter gate structures INT_GS1, INT_GS2, and INT_GS3 contacting the first source/drain pattern 150 may have a convexly curved surface. A side wall of a portion of the gate structure GS disposed between the first sheet pattern NS1 disposed at the topmost level and the gate etching stop pattern 125 and contacting the first source/drain pattern 150 may have a convexly curved surface.

In a cross-sectional view cut along the first direction D1 in which the first lower pattern BP1 extends, each of the inter gate structures INT_GS1, INT_GS2, and INT_GS3 may protrude toward the first source/drain pattern 150 as the first sheet pattern NS does. However, the inter gate structures INT_GS1, INT_GS2, and INT_GS3 do not protrude beyond the connective surface NS1_CS of the first sheet pattern. The width of the width extension area 150_ER of the first source/drain pattern increases, then decreases, and then increases again and then decreases as the width extension area extends away from the upper surface BP1_US of the first lower pattern.

Figure 14:
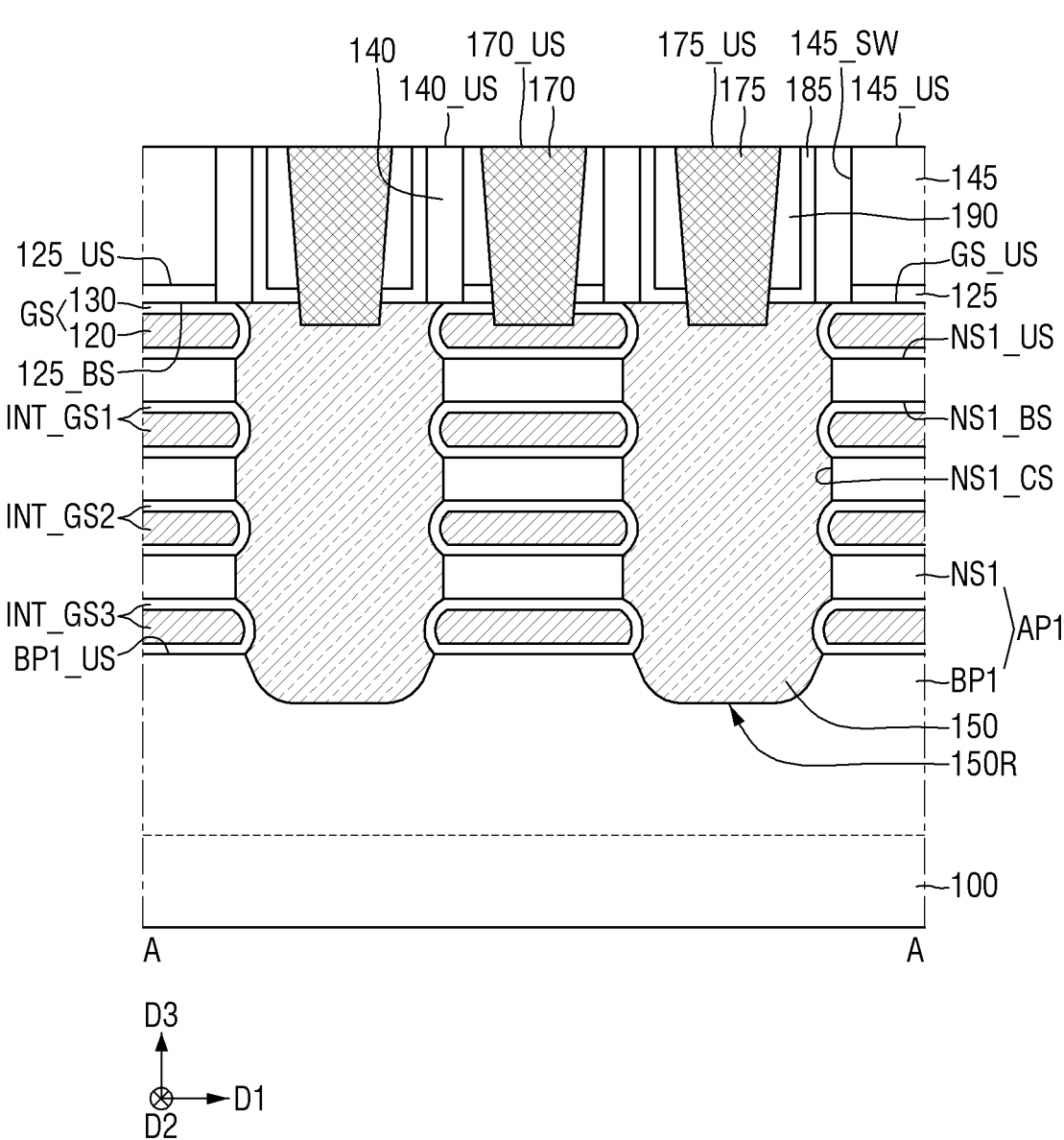
FIG. 14 is a view of the semiconductor device according to some embodiments.

FIG. 14 is a diagram of a semiconductor device according to some embodiments. For convenience of description, following descriptions are based on differences relative to the embodiment of FIG. 1 to FIG. 4.

Referring to FIG. 14, in a semiconductor device according to some embodiments, each of the inter gate structures INT_GS1, INT_GS2, and INT_GS3 may protrude beyond the connective surface NS1_CS of at least one first sheet pattern toward the first source/drain pattern 150 and in the first direction D1. Alternatively, a portion of the gate structure GS disposed between the first sheet pattern NS1 disposed at the topmost level and the gate etching stop pattern 125 may protrude beyond the connective surface NS1_CS of the first sheet pattern disposed at the topmost level toward the first source/drain pattern 150 and in the first direction D1.

For example, a portion of the first inter gate structure INT_GS1 and a portion of the second inter gate structure INT_GS2 may protrude beyond the connective surface NS1_CS of the first sheet pattern between the first inter gate structure INT_GS1 and the second inter gate structure INT_GS2 toward the first source/drain pattern 150. A portion of the second inter gate structure INT_GS2 and a portion of the third inter gate structure INT_GS3 may protrude beyond the connective surface NS1_CS of the first sheet pattern between the second inter gate structure INT_GS2 and the third inter gate structure INT_GS3 toward the first source/drain pattern 150.

Figure 15:
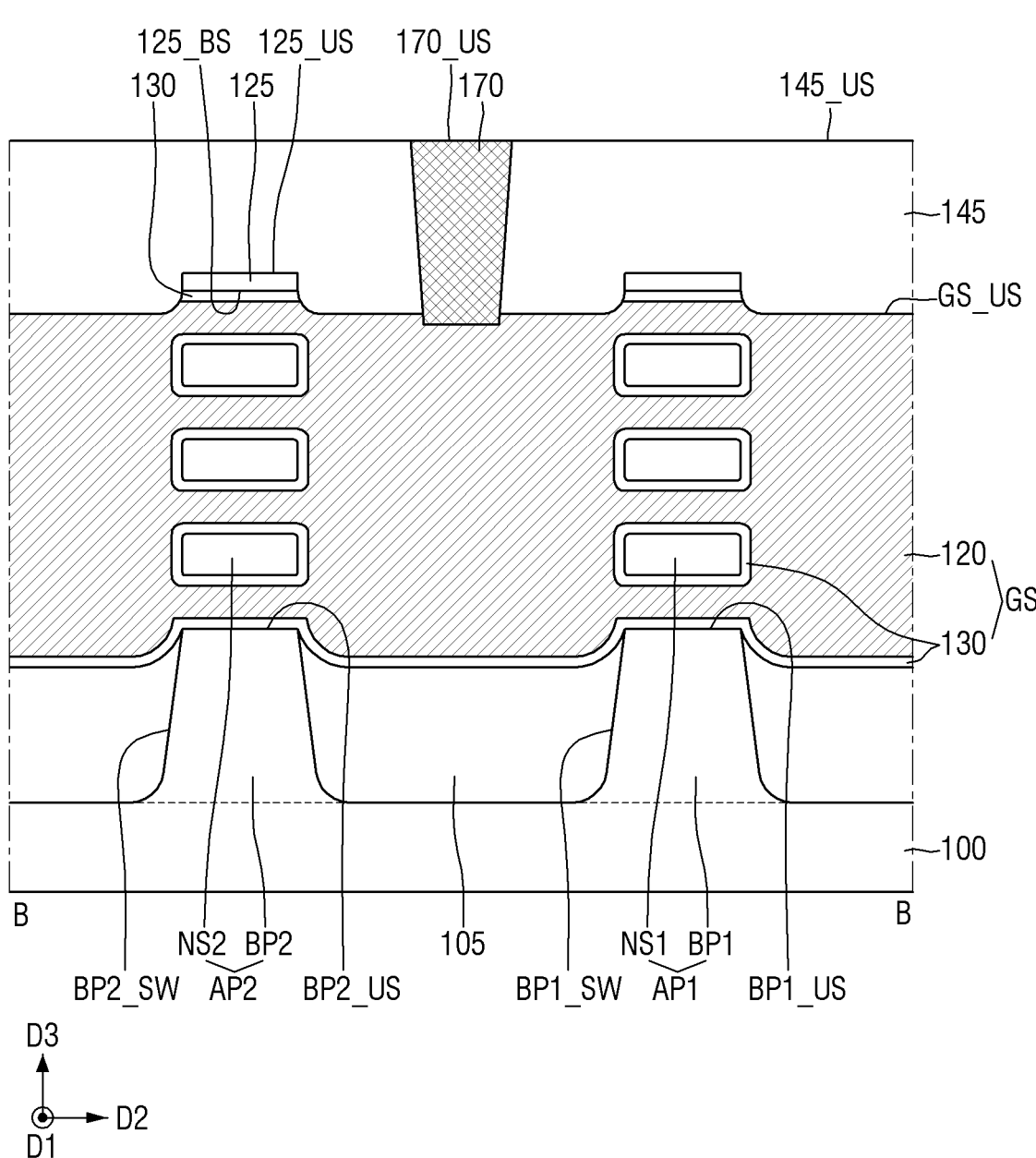
FIG. 15 is a view of the semiconductor device according to some embodiments.
Figure 16:
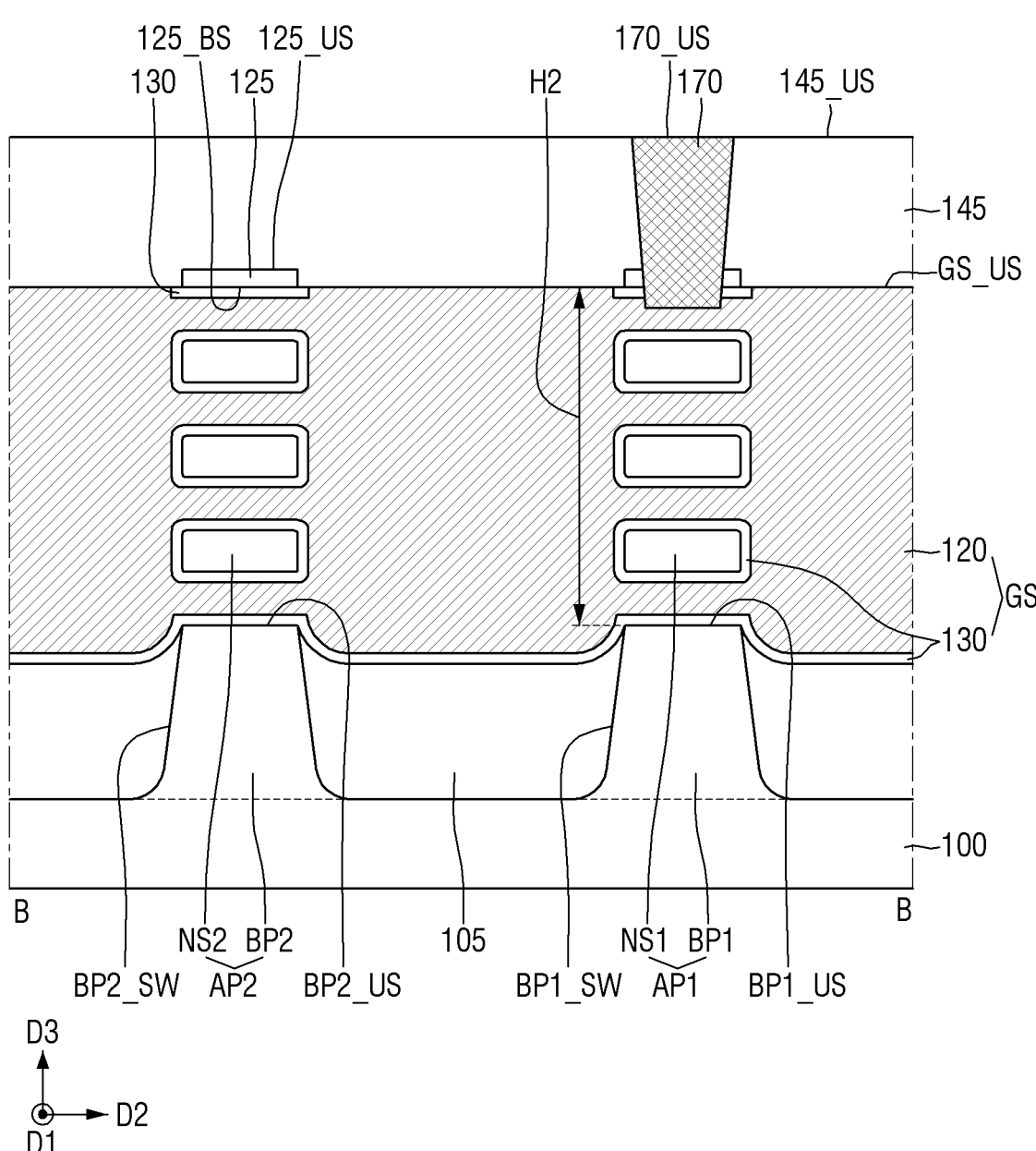
FIG. 16 is a view of the semiconductor device according to some embodiments.
Figure 17:
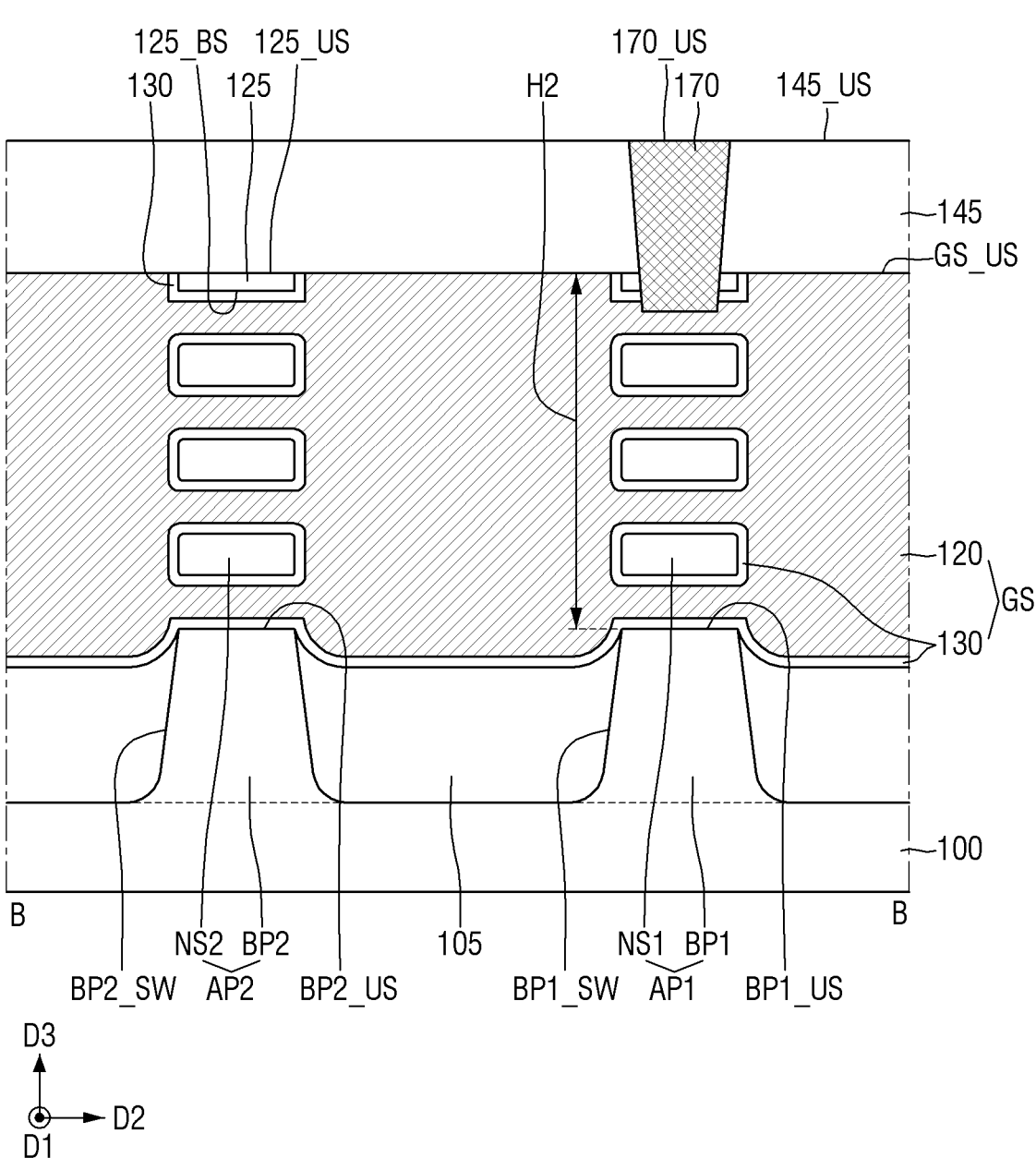
FIG. 17 is a view of the semiconductor device according to some embodiments.

FIG. 15 is a diagram of a semiconductor device according to some embodiments. FIG. 16 is a diagram of a semiconductor device according to some embodiments. FIG. 17 is a diagram of a semiconductor device according to some embodiments. For convenience of description, following descriptions are based on differences relative to the embodiment of FIG. 1 to FIG. 4.

Referring to FIG. 15, in a semiconductor device according to some embodiments, the gate contact 170 may be connected to the gate electrode 120 in an area in which the gate structure GS does not overlap the first sheet pattern NS1 and the second sheet pattern NS2. The gate contact 170 may be disposed on an upper surface of the field insulating film 105. The gate contact 170 may be connected to the gate electrode 120 while not extending through the gate etching stop pattern 125.

Referring to FIG. 16, in a semiconductor device according to some embodiments, a vertical dimension H1 from the upper surface BP1_US of the first lower pattern to the upper surface GS_US of the gate structure in an area where the gate structure GS overlaps the first sheet pattern NS1 may be the same as a vertical dimension H2 from the upper surface BP1_US of the first lower pattern to the upper surface GS_US of the gate structure in an area where the gate structure GS overlaps the field insulating film 105.

Referring to FIG. 17, in a semiconductor device according to some embodiments, a vertical dimension H1 from the upper surface BP1_US of the first lower pattern to the upper surface GS_US of the gate structure in an area where the gate structure GS overlaps the first sheet pattern NS1 may be greater than a vertical dimension H2 from the upper surface BP1_US of the first lower pattern to the upper surface GS_US of the gate structure in an area where the gate structure GS overlaps the field insulating film 105.

In an area where the gate structure GS overlaps with the field insulating film 105, a vertical dimension from the upper surface BP1_US of the first lower pattern to the upper surface GS_US of the gate structure may be the same as a vertical dimension from the upper surface BP1_US of the first lower pattern to the upper surface 125_US of the gate etching stop pattern.

Figure 18:
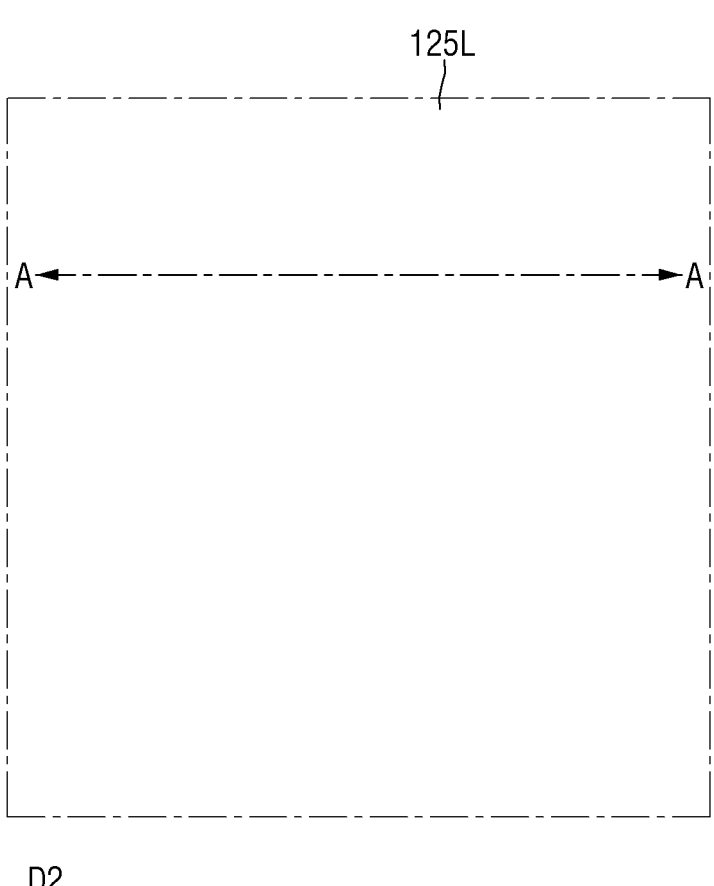
FIGS. 18 to 30 are stage diagrams in a method for fabricating a semiconductor device according to some embodiments of the present disclosure.
Figure 19:
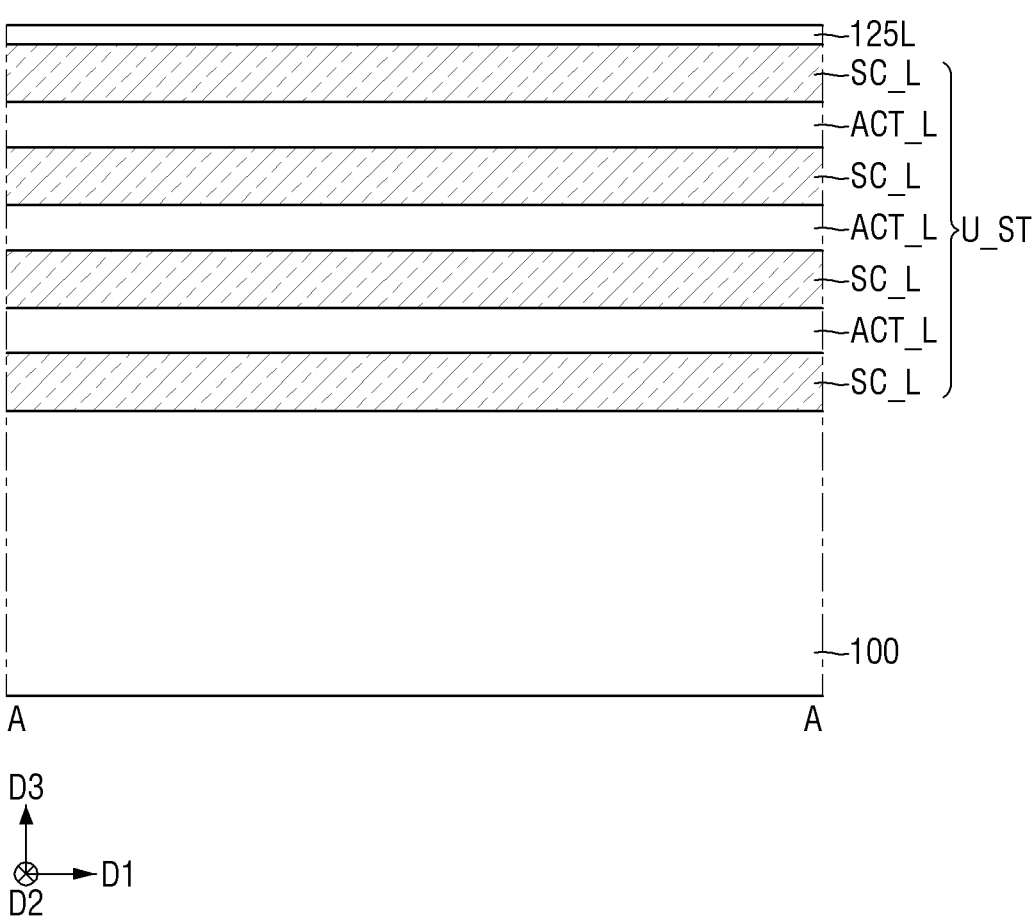
Figure 20:
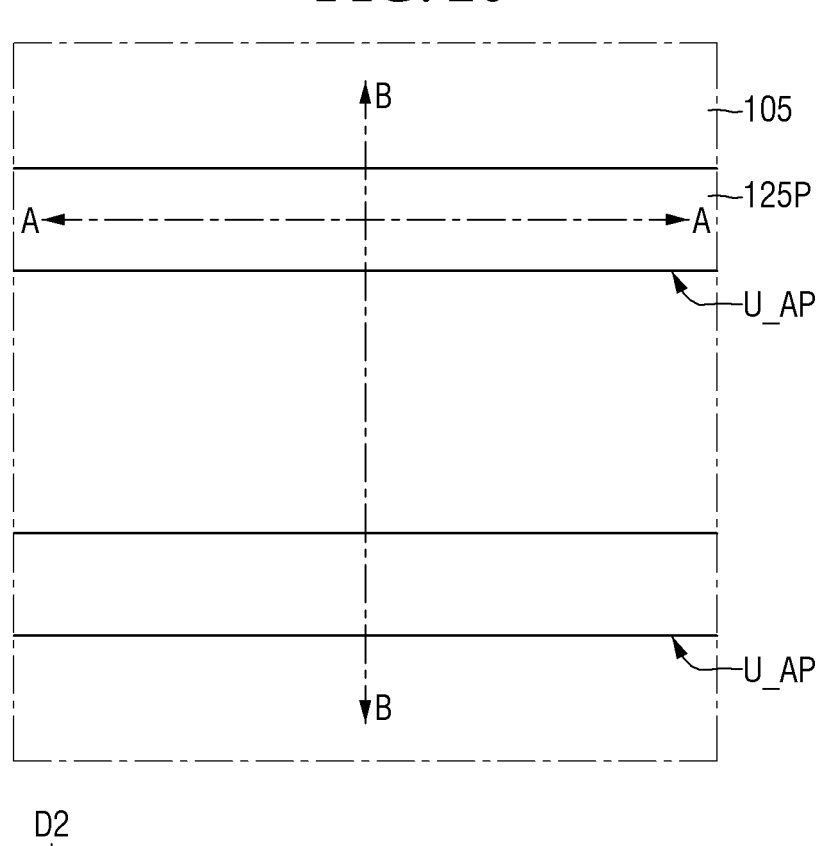
Figure 20:
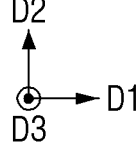
Figure 21:
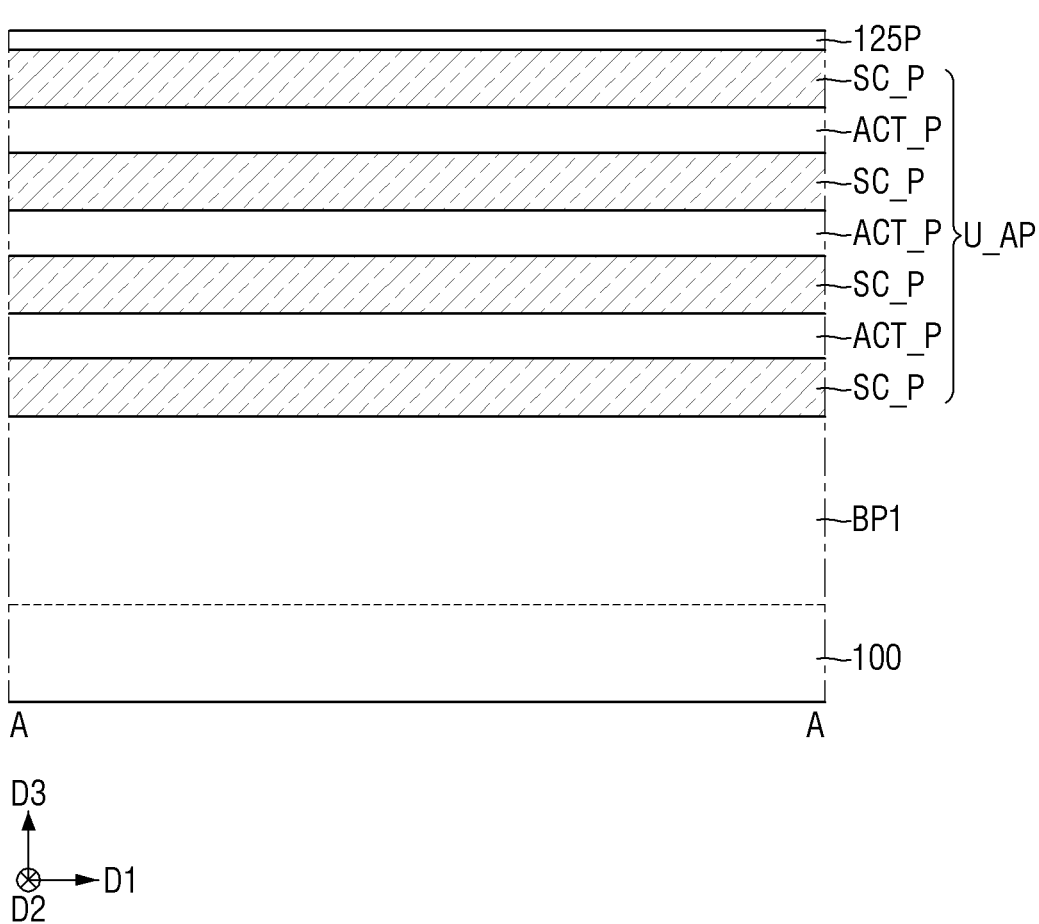
Figure 22:
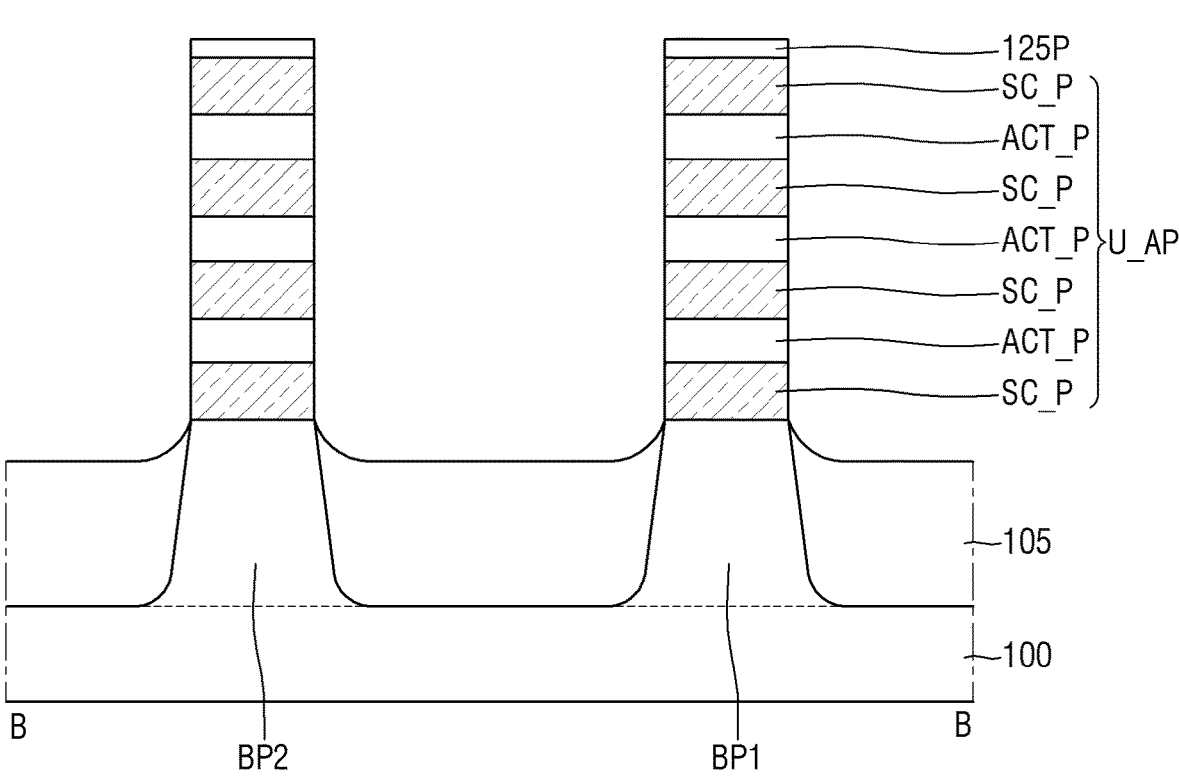
Figure 22:
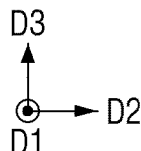

FIG. 18 to FIG. 30 are diagrams of intermediate stages in a method for manufacturing a semiconductor device according to some embodiments. FIG. 18 and FIG. 20 are schematic plan views, FIG. 19 is a cross-sectional view taken along line A-A of FIG. 18, and FIG. 21 and FIG. 22 are cross-sectional views taken along lines A-A and B-B of FIG. 20, respectively. FIG. 23 to FIG. 30 are cross-sectional views taken along line A-A of FIG. 20.

Referring to FIG. 18 and FIG. 19, a stack film structure U_ST may be formed on the substrate 100.

The stack film structure U_ST may include a plurality of sacrificial films SC_L and a plurality of active films ACT_L. The plurality of sacrificial films SC_L and the plurality of active films ACT_L may be alternately stacked with each other. The stack film structure U_ST may have a starting film as the sacrificial film SC_L and an ending film as the sacrificial film SC_L. In other words, the bottommost film of the stack film structure U_ST may be the sacrificial film SC_L. The topmost film of the stack film structure U_ST may be the sacrificial film SC_L. That is, one of the plurality of sacrificial films SC_L may be the topmost film of the stack film structure U_ST.

For example, the sacrificial film SC_L may include a silicon-germanium film. The active film ACT_L may include a silicon film.

Subsequently, a gate etching stop film 125L may be formed on the stack film structure U_ST, e.g., on the topmost sacrificial film SC_L. For example, the gate etching stop film 125L may completely cover the topmost sacrificial film SC_L.

Referring to FIG. 20 to FIG. 22, the gate etching stop film 125L and the stack film structure U_ST may be patterned to form a pattern structure U_AP and a pre-etching stop pattern 125P.

The stack film structure U_ST may be patterned to form the pattern structure U_AP. The gate etching stop film 125L may be patterned to form the pre-etching stop pattern 125P. Each of the pattern structure U_AP and the pre-etching stop pattern 125P may extend in the first direction D1.

The pre-etching stop pattern 125P may be formed on the pattern structure U_AP. The pattern structure U_AP may include the sacrificial patterns SC_P and the active patterns ACT_P as alternately stacked with each other.

While the pattern structure U_AP is formed, a portion of the substrate 100 may be etched to form the first lower pattern BP1 and the second lower pattern BP2. The pattern structure U_AP is formed on the first lower pattern BP1 and the second lower pattern BP2.

Subsequently, the field insulating film 105 may be formed on the substrate 100. The field insulating film 105 may cover the side wall of the first lower pattern BP1 and the side wall of the second lower pattern BP2.

Figure 23:
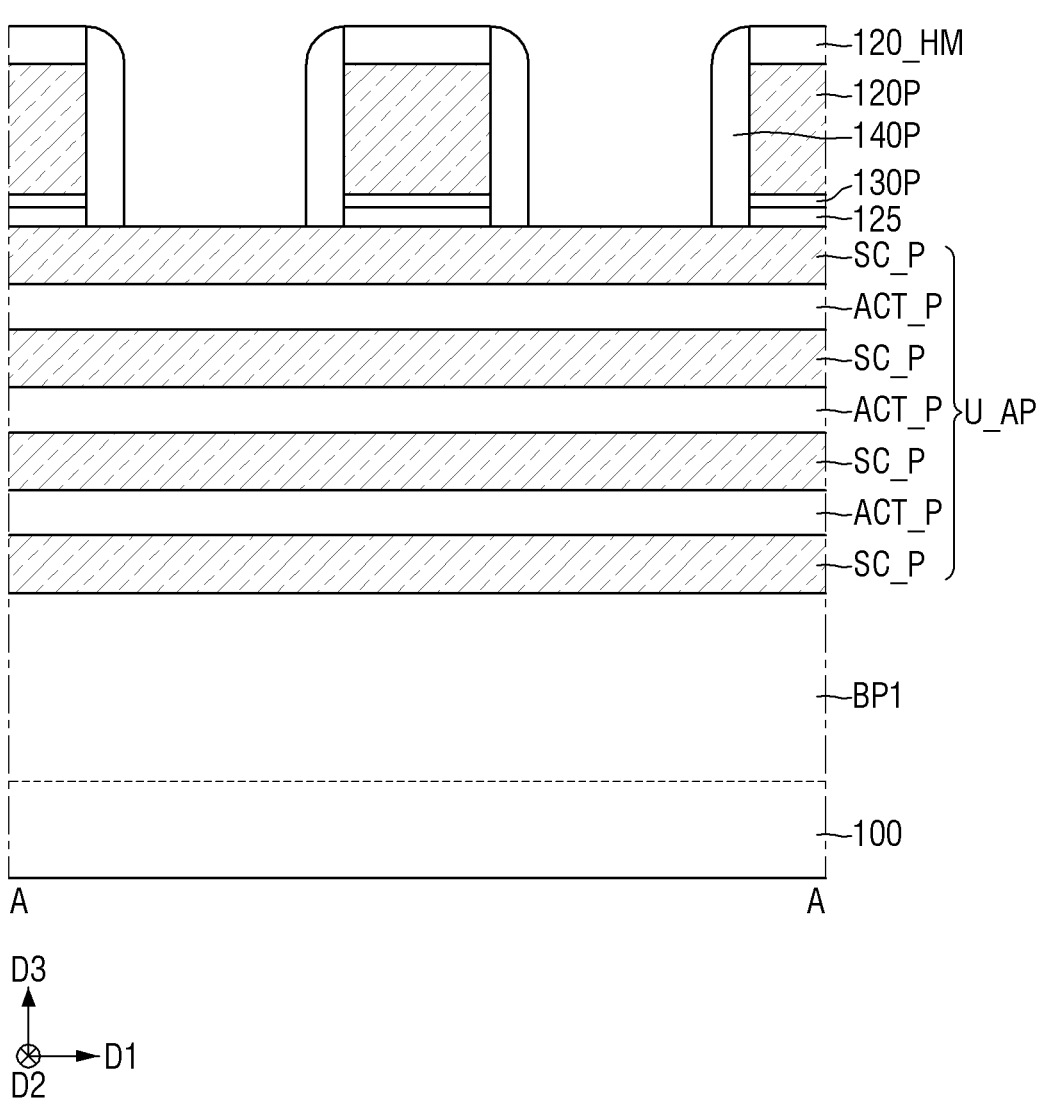

Referring to FIG. 23, a dummy gate insulating film 130P, a dummy gate electrode 120P, and a dummy gate capping film 120_HM may be formed on the pattern structure U_AP. The dummy gate electrode 120P may extend in an elongated manner in the second direction (D2 in FIG. 20).

The dummy gate insulating film 130P may include, e.g., silicon oxide. The dummy gate electrode 120P may include, e.g., polysilicon. The dummy gate capping film 120_HM may include, e.g., silicon nitride.

While the dummy gate electrode 120P is formed, the pre-etching stop pattern 125P may be patterned. The pre-etching stop pattern 125P may be patterned such that the gate etching stop pattern 125 may be formed on the pattern structure U_AP.

The dummy gate insulating film 130P, the dummy gate electrode 120P, and the dummy gate capping film 120_HM may be formed on the gate etching stop pattern 125. Subsequently, a pre-pre gate spacer 140P may be formed on a side wall of the dummy gate electrode 120P.

In another example, the gate etching stop pattern 125 may be formed while the pre-gate spacer 140P is formed.

Figure 24:
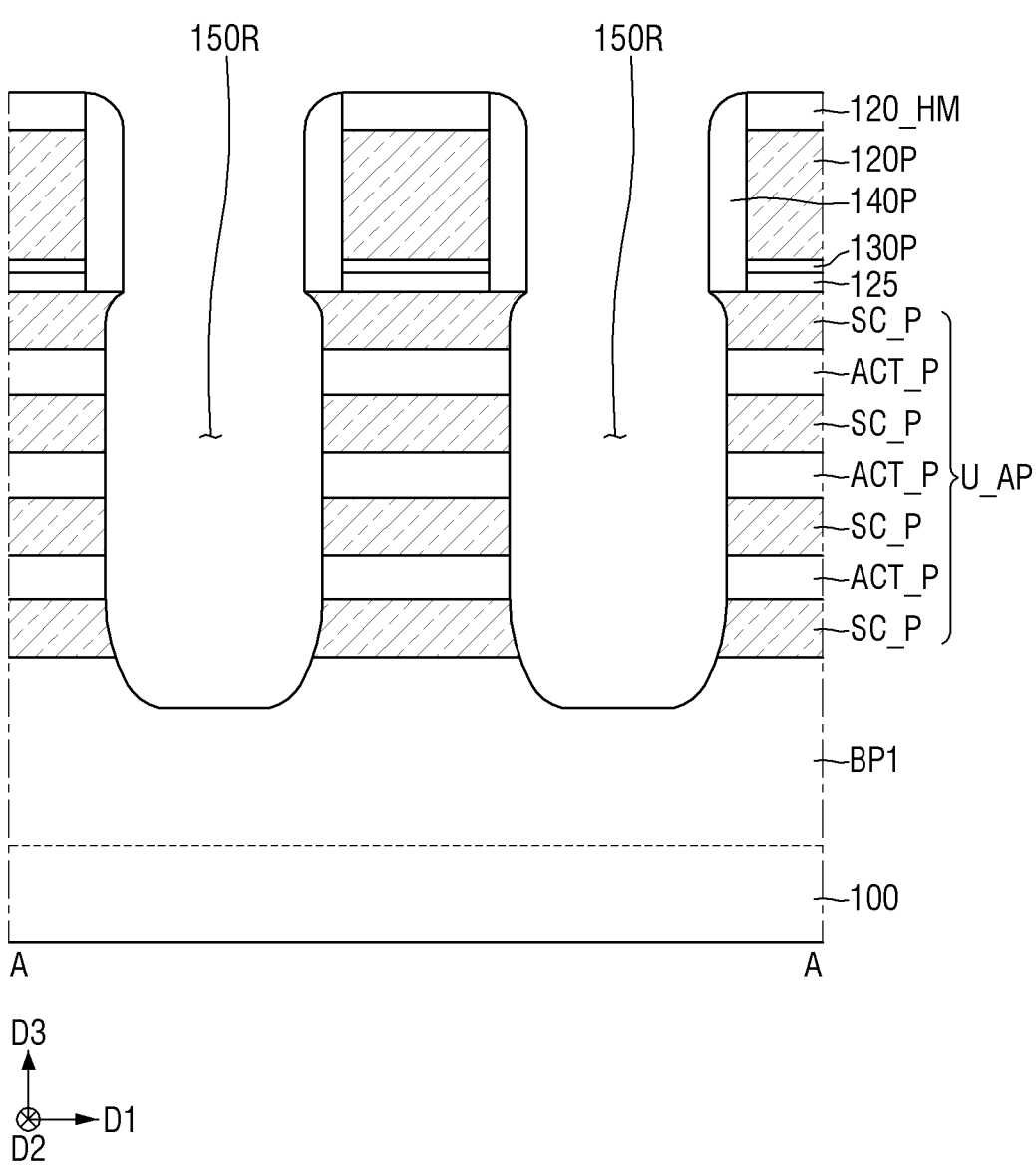

Referring to FIG. 24, the source/drain recess 150R may be formed in the pattern structure U_AP using the dummy gate electrode 120P as a mask. A portion of the source/drain recess 150R may be formed in the first lower pattern BP1. The source/drain recess 150R may be formed on at least one side of the dummy gate electrode 120P.

Figure 25:
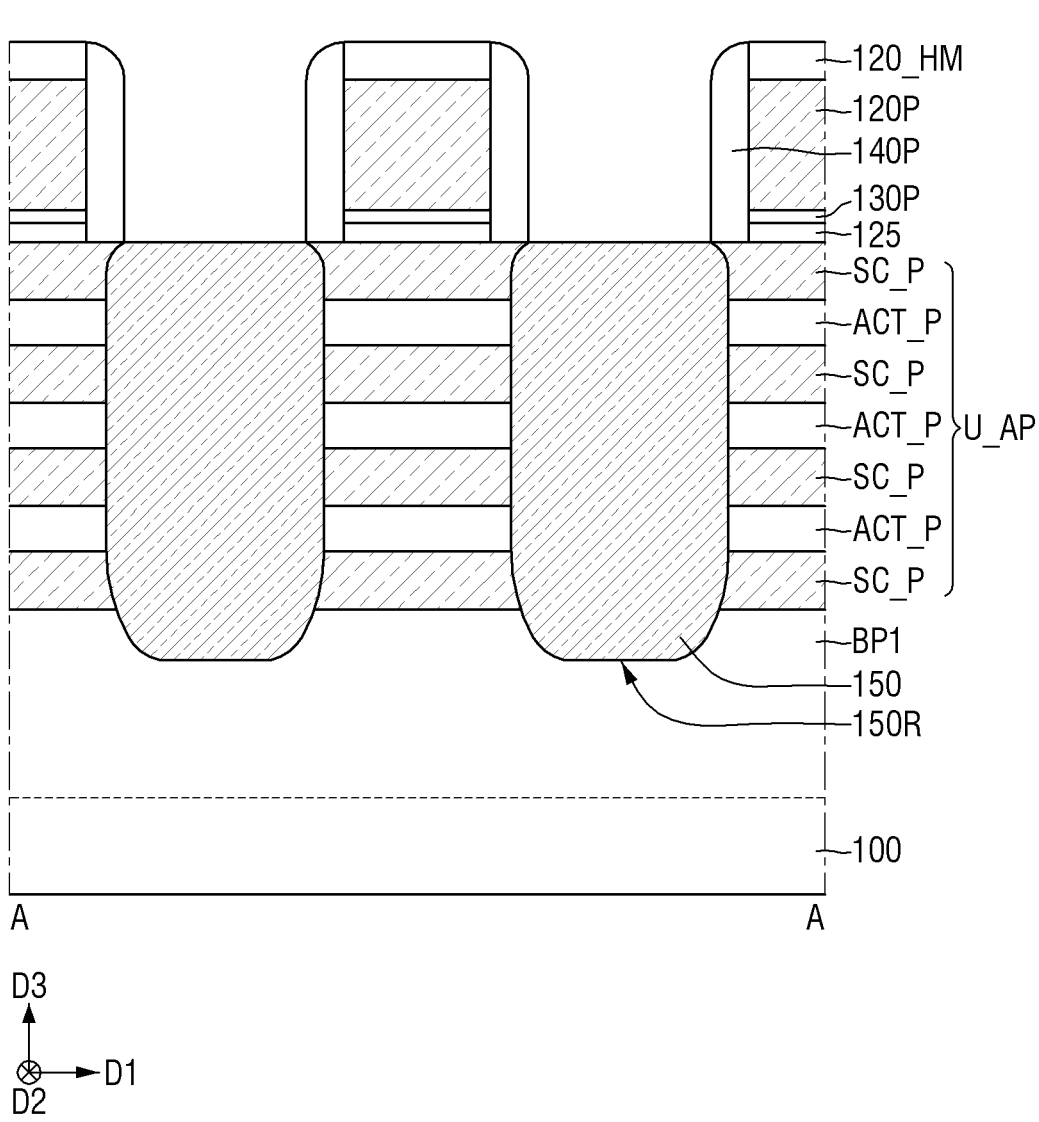

Referring to FIG. 25, the first source/drain pattern 150 may be formed in the source/drain recess 150R. The first source/drain pattern 150 may be formed on at least one side of the dummy gate electrode 120P.

The first source/drain pattern 150 may be formed on the first lower pattern BP1. The first source/drain pattern 150 may directly contact the sacrificial pattern SC_P and active pattern ACT_P.

Figure 26:
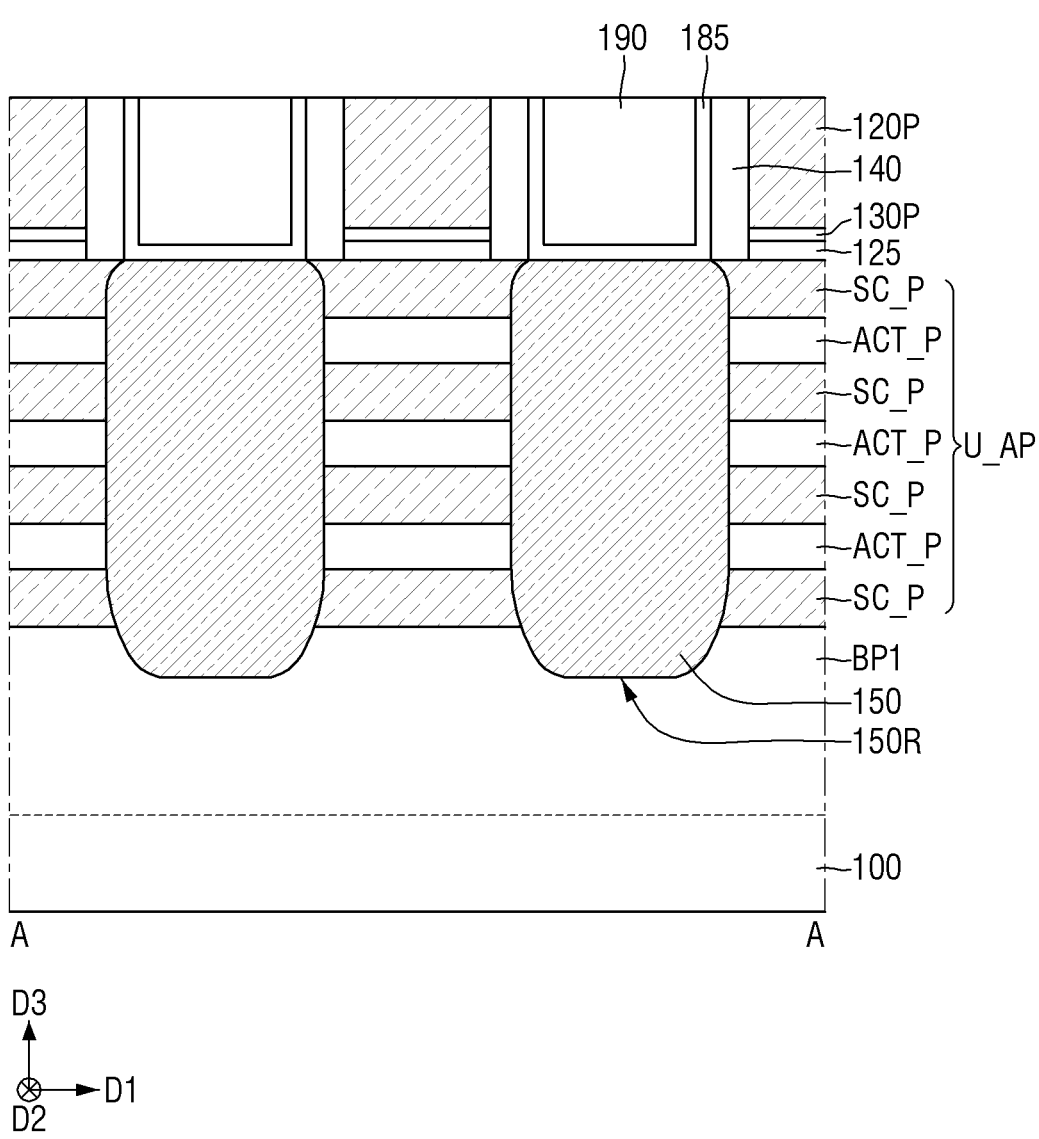

Referring to FIG. 26, the etching stop film 185 and the interlayer insulating film 190 are sequentially formed on the first source/drain pattern 150. While forming the interlayer insulating film 190, the dummy gate capping film 120_HM is removed to expose an upper surface of the dummy gate electrode 120P. While the upper surface of the dummy gate electrode 120P is exposed, the gate spacer 140 may be formed.

Figure 27:
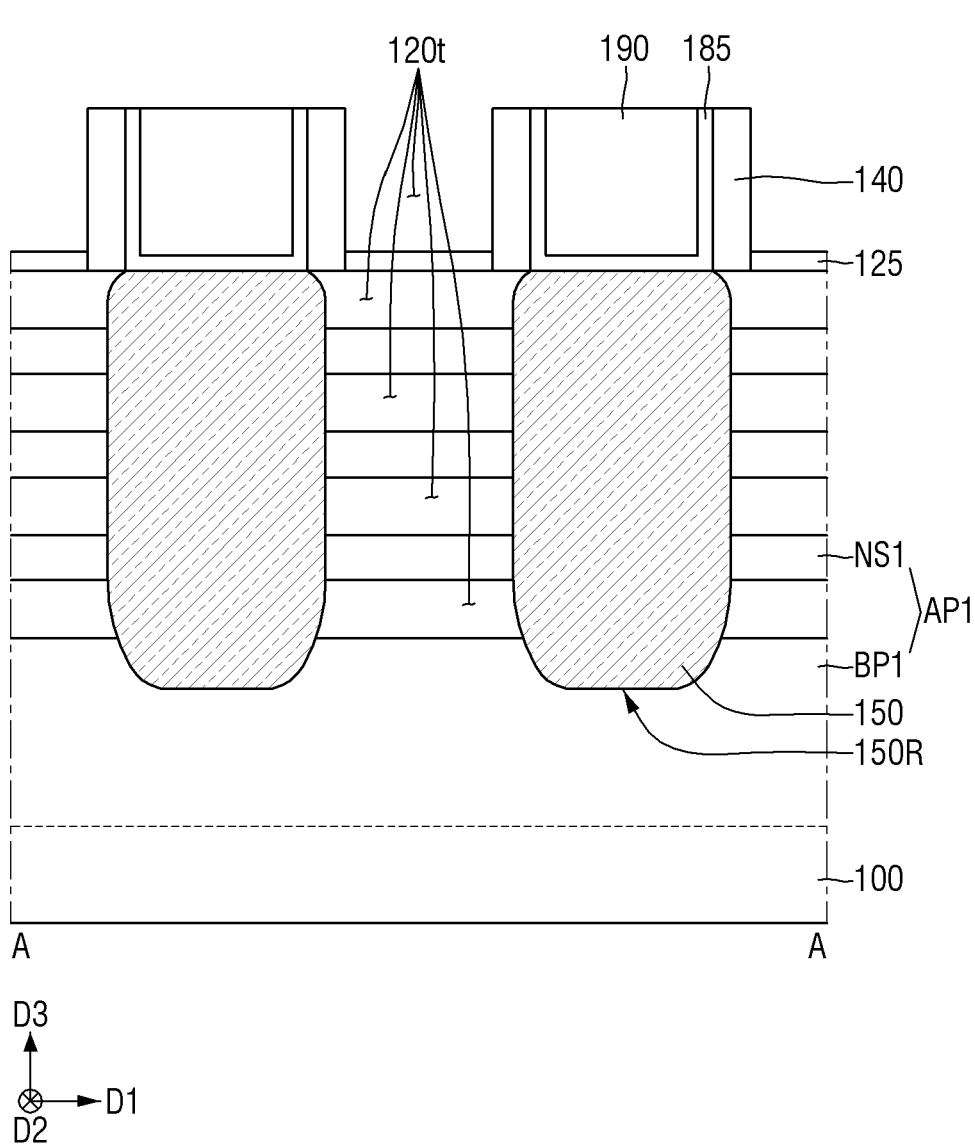

Referring to FIG. 27, the dummy gate insulating film 130P and the dummy gate electrode 120P may be removed to expose the pattern structure U_AP and the gate etching stop pattern 125. The gate etching stop pattern 125 may be disposed on the upper surface of the pattern structure U_AP, while a side wall of the pattern structure U_AP may be exposed.

Subsequently, the sacrificial pattern SC_P of the exposed pattern structure U_AP may be removed to form the first sheet pattern NS1. Thus, a gate trench 120t may be formed between the gate spacers 140. Further, the first active pattern AP1 including the first lower pattern BP1 and the first sheet pattern NS1 may be formed.

Figure 28:
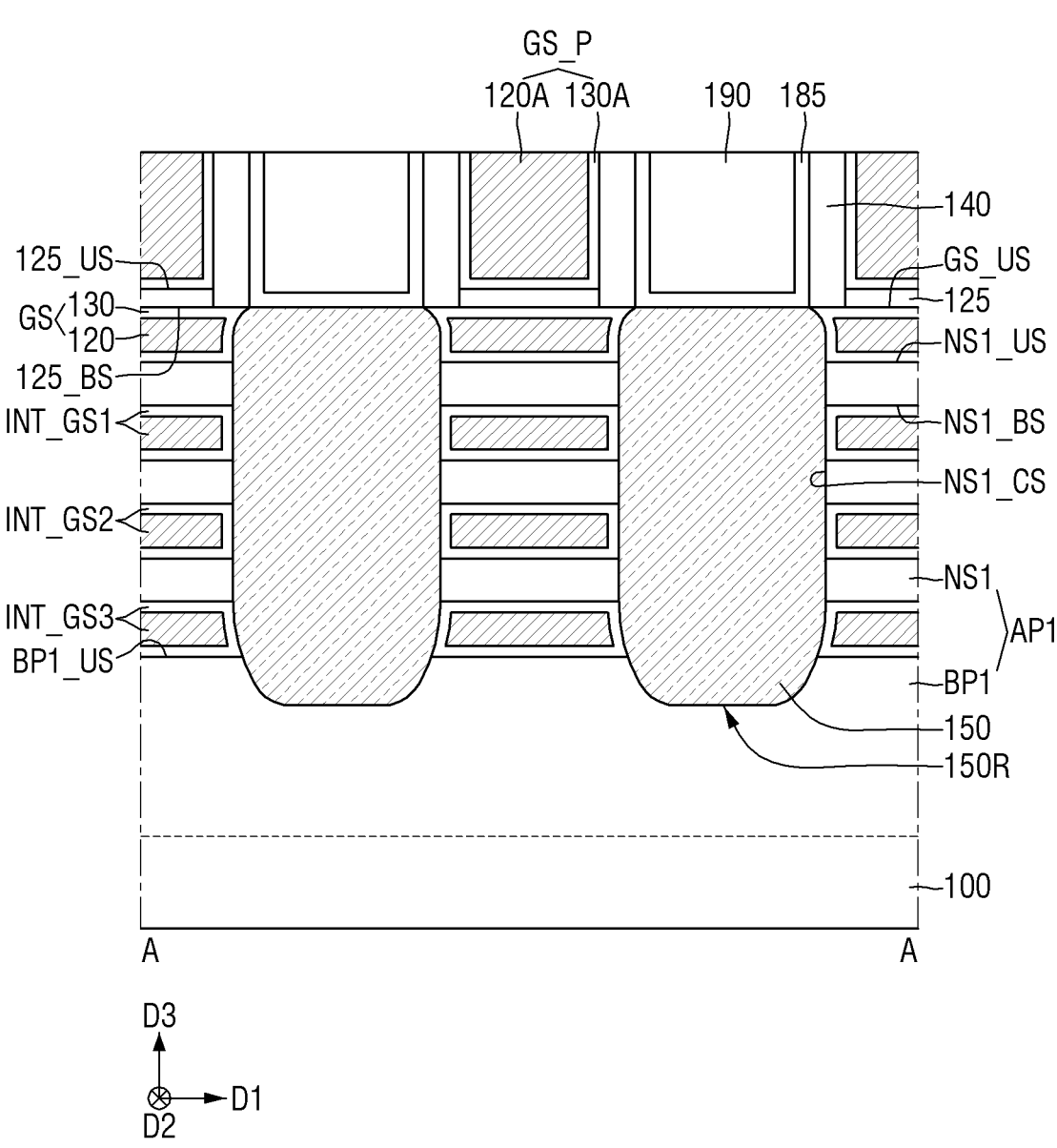

Referring to FIG. 28, a pre-gate structure GS_P surrounding the first sheet pattern NS1 may be formed in the gate trench 120t. The pre-gate structure GS_P may cover the gate etching stop pattern 125. The pre-gate structure GS_P may include a pre-gate insulating film 130A and a pre-gate electrode 120A.

Figure 29:
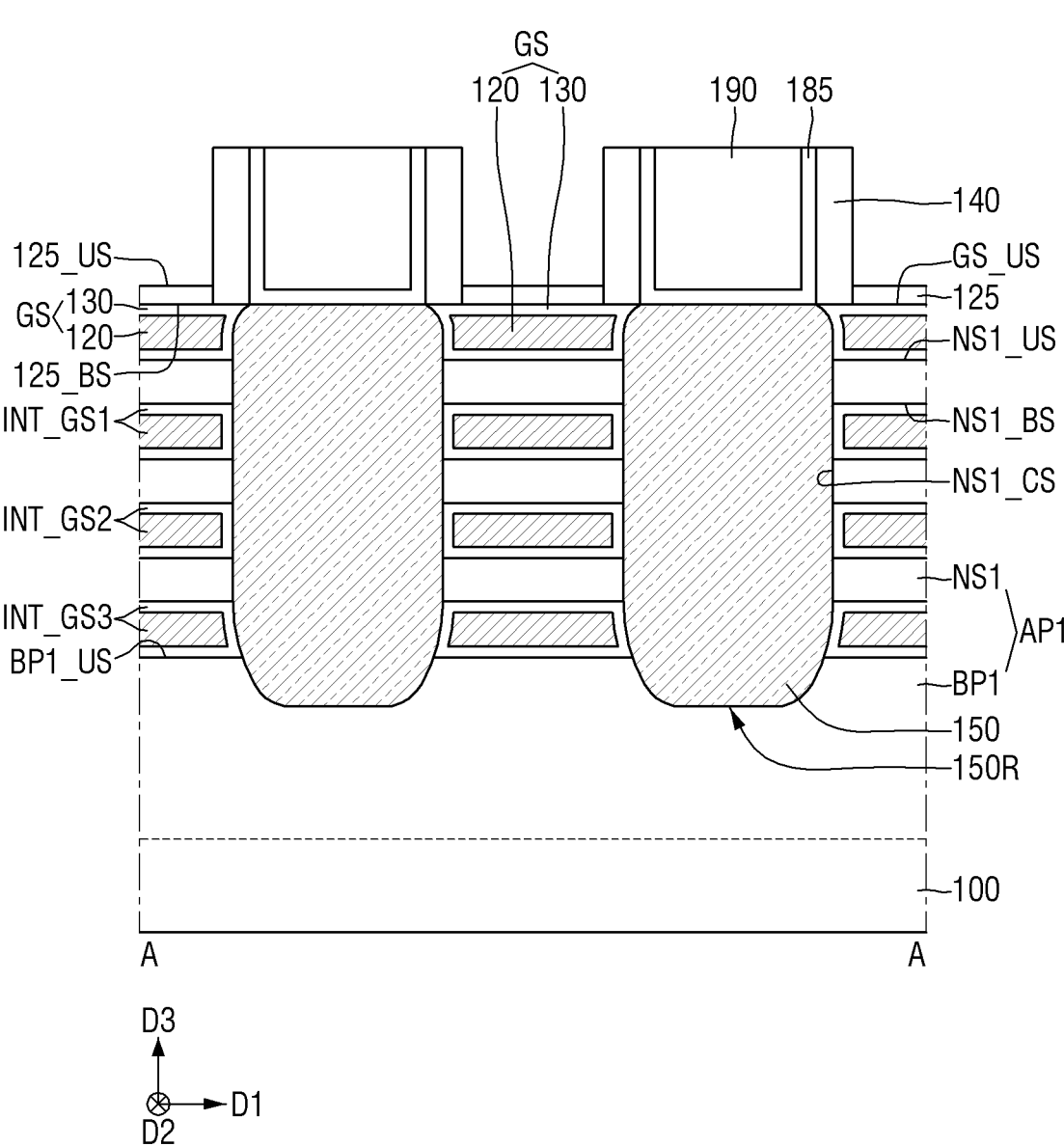

Referring to FIG. 29, a portion of the pre-gate structure GS_P may be etched so that the gate etching stop pattern 125 is exposed. A portion of the pre-gate structure GS_P may be removed to form the gate structure GS surrounding the first sheet pattern NS1.

Figure 30:
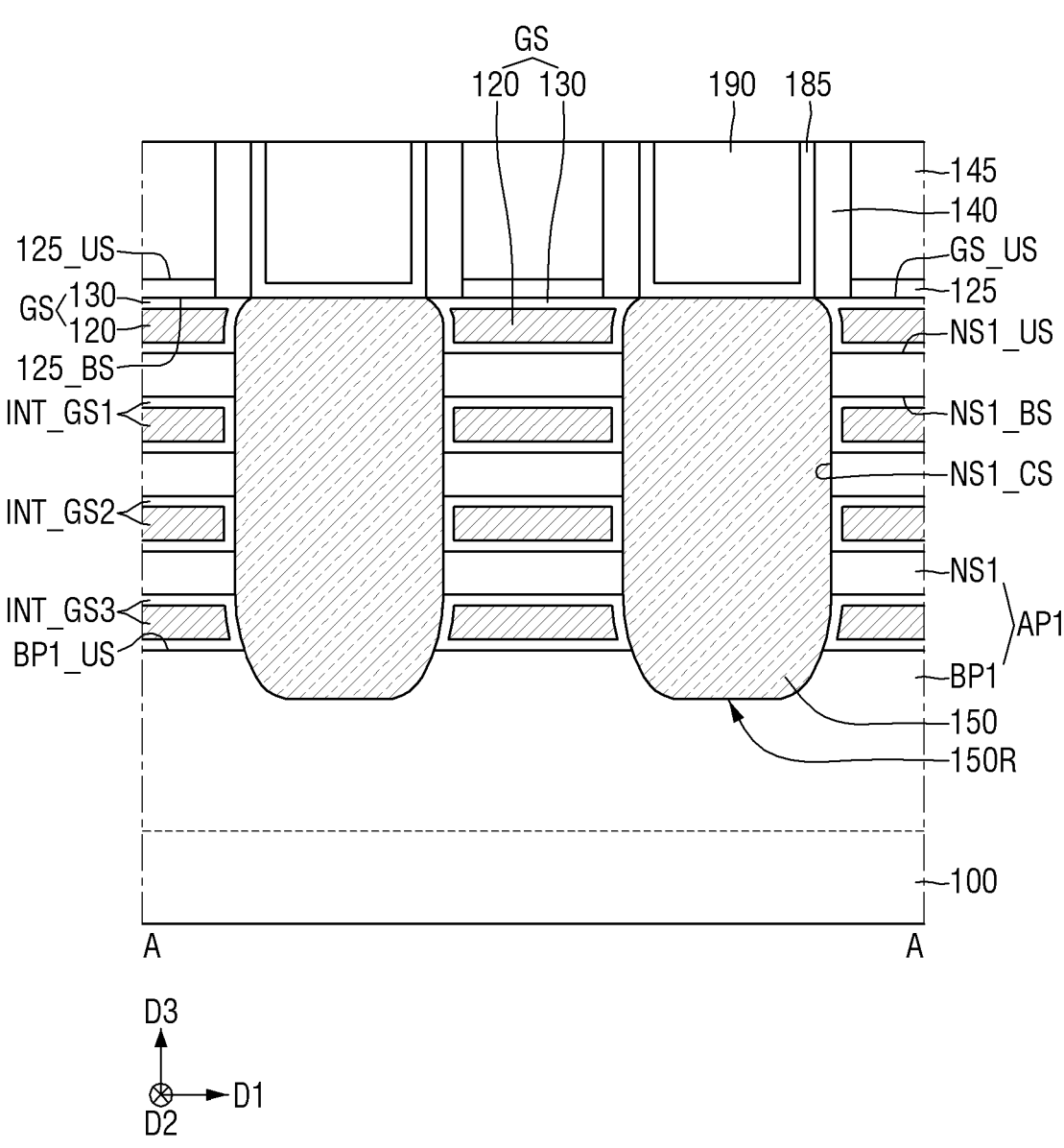

Referring to FIG. 30, the gate capping pattern 145 may be formed on the gate etching stop pattern 125. The gate capping pattern 145 may fill a space in which the pre-gate structure GS_P has been removed. Subsequently, referring to FIG. 2, the gate contact 170 and the source/drain contact 175 may be formed.

By way of summation and review, an aspect of the present disclosure provides a semiconductor device capable of improving element performance and reliability, as well as a method for manufacturing a semiconductor device capable of improving element performance and reliability. That is, according to example embodiments, an etch stop layer may be positioned on a portion of a gate electrode (e.g., SiGe layer) above a topmost nanosheet, so when the gate is recessed through the etch stop layer on the nanosheet, the capacitance between the gate and the source/drain contact may be eliminated or substantially reduced. Also, the recessed gate reduces a risk of a short between the gate and the source/drain contact and allows a stack down.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active pattern including:
a lower pattern extending in a first direction, and
a plurality of sheet patterns spaced apart from the lower pattern in a second direction, each of the plurality of sheet patterns having an upper surface and a bottom surface opposite to each other in the second direction;
a gate structure on the lower pattern, the gate structure including a gate electrode and a gate insulating film that surround each of the plurality of sheet patterns;
a gate capping pattern on the gate structure and extending along an upper surface of the gate structure;
a gate etching stop pattern between the gate capping pattern and the gate structure;
a gate spacer extending along a side wall of the gate capping pattern;
a source/drain pattern on at least one side of the gate structure;
a gate contact on the gate electrode, the gate contact extending through the gate capping pattern and directly contacting the gate electrode, and an upper surface of the gate contact being coplanar with an upper surface of the gate spacer; and
a source/drain contact on the source/drain pattern and connected to the source/drain pattern,
wherein a lower surface of the gate contact is at a vertical level lower than a vertical level of an upper surface of the source/drain pattern.

2. The semiconductor device as claimed in claim 1, wherein a vertical distance from an upper surface of the lower pattern to the upper surface of the source/drain pattern is equal to or greater than a vertical distance from the upper surface of the lower pattern to the upper surface of the gate structure.

3. The semiconductor device as claimed in claim 1, wherein the upper surface of the gate spacer is coplanar with an upper surface of the gate capping pattern.

4. The semiconductor device as claimed in claim 1, wherein the gate etching stop pattern includes a plurality of etching stop patterns.

5. The semiconductor device as claimed in claim 1, wherein:
the gate structure includes a plurality of inter gate structures, at least one of the plurality of inter gate structures being between the lower pattern and the plurality of sheet patterns, and at least another of the plurality of inter gate structures being between adjacent ones of the plurality of sheet patterns, and
the source/drain pattern is in contact with each of the plurality of inter gate structures.

6. The semiconductor device as claimed in claim 5, wherein:
the plurality of inter gate structures includes a first inter gate structure between a first pair of adjacent ones of the plurality of sheet patterns and a second inter gate structure between a second pair of adjacent ones of the plurality of sheet patterns, and
a width in the first direction of the first inter gate structure is equal to a width in the first direction of the second inter gate structure.

7. The semiconductor device as claimed in claim 5, wherein:

the plurality of inter gate structures includes a first inter gate structure, a second inter gate structure, and a third inter gate structure sequentially arranged on the lower pattern, a width in the first direction of the second inter gate structure is smaller than a width in the first direction of the first inter gate structure, and the width in the first direction of the second inter gate structure is smaller than a width in the first direction of the third inter gate structure.

8. The semiconductor device as claimed in claim 1, further comprising an inner spacer between the gate structure and the source/drain pattern, wherein the gate structure includes a plurality of inter gate structures in contact with the inner spacer, the plurality of inter gate structures having a first inter gate structure between the lower pattern and the plurality of sheet patterns, and a second inter gate structure between adjacent ones of the plurality of sheet patterns.

9. The semiconductor device as claimed in claim 1, wherein the gate contact extends through the gate etching stop pattern.

10. The semiconductor device as claimed in claim 1, wherein the gate spacer has a first width in the first direction, an upper surface of the gate etching stop pattern contacting the gate spacer by a second width in the first direction, and the second width being smaller than or equal to the first width.

11. The semiconductor device as claimed in claim 1, further comprising a field insulating film covering a side wall of the lower pattern, the gate etching stop pattern overlapping the plurality of sheet patterns in the second direction without overlapping the field insulating film in the second direction.

12. The semiconductor device as claimed in claim 11, wherein:

in an area in which the gate structure overlaps the field insulating film, a vertical distance from an upper surface of the lower pattern to the upper surface of the gate structure is a first vertical distance, in an area in which the gate structure overlaps the plurality of sheet patterns, a vertical distance from the upper surface of the lower pattern to the upper surface of the gate structure is a second vertical distance, and the second vertical distance is greater than the first vertical distance.

13. The semiconductor device as claimed in claim 1, wherein the gate etching stop pattern has an upper surface facing toward the gate capping pattern and a bottom surface facing toward the gate structure, the gate insulating film extending along the bottom surface of the gate etching stop pattern.

14. The semiconductor device as claimed in claim 1, wherein the source/drain pattern includes a plurality of width extension areas, a width in the first direction of each of the plurality of width extension areas increasing and then decreasing as each of the plurality of width extension areas extends away from an upper surface of the lower pattern.

15. The semiconductor device as claimed in claim 1, wherein:

the gate structure includes a plurality of inter gate structures, at least one of the plurality of inter gate structures being between the lower pattern and the plurality of sheet patterns, and at least another one of the plurality of inter gate structures being between adjacent ones of the plurality of sheet patterns, the plurality of inter gate structures includes a first inter gate structure and a second inter gate structure, the plurality of sheet patterns includes a first sheet pattern between the first inter gate structure and the second inter gate structure, the first sheet pattern having a boundary surface in contact with the source/drain pattern, and a portion of each of the first inter gate structure and the second inter gate structure extends beyond the boundary surface of the first sheet pattern toward the source/drain pattern.

16. A semiconductor device, comprising:

an active pattern including:

a lower pattern extending in a first direction, and a plurality of sheet patterns spaced apart from the lower pattern in a second direction, each of the plurality of sheet patterns having an upper surface and a bottom surface opposite to each other in the second direction;

a gate structure on the lower pattern, the gate structure including a gate electrode and a gate insulating film that surround each of the plurality of sheet patterns;

a gate capping pattern on the gate structure and extending along an upper surface of the gate structure;

a gate etching stop pattern between the gate capping pattern and the gate structure;

a gate spacer extending along a side wall of the gate capping pattern;

a source/drain pattern on at least one side of the gate structure;

a gate contact on the gate electrode, the gate contact extending through the gate capping pattern and directly contacting the gate electrode; and a source/drain contact on the source/drain pattern and connected to the source/drain pattern, wherein the gate structure includes a first inter gate structure between the lower pattern and the plurality of sheet patterns, a second inter gate structure between adjacent ones of the plurality of sheet patterns, the first inter gate structure and the second inter gate structure in contact with the source/drain pattern, wherein a lower surface of the gate contact is at vertical level lower than a vertical level of an upper surface of the source/drain pattern.

17. The semiconductor device as claimed in claim 16, wherein an upper surface of the gate spacer is coplanar with an upper surface of the gate contact and with the upper surface of the source/drain contact.

18. The semiconductor device as claimed in claim 16, further comprising:

a field insulating film covering a side wall of the lower pattern, the gate etching stop pattern overlapping the plurality of sheet patterns in the second direction without overlapping the field insulating film in the second direction, wherein in an area in which the gate structure overlaps the field insulating film, a vertical distance from an upper surface of the lower pattern to the upper surface of the gate structure is a first vertical distance, and wherein in an area in which the gate structure overlaps the plurality of sheet patterns, a vertical distance from the upper surface of the lower pattern to the upper surface of the gate structure is a second vertical distance, the second vertical distance being greater than the first vertical distance.

19. The semiconductor device as claimed in claim 16, wherein the gate etching stop pattern has an upper surface facing toward the gate capping pattern and a bottom surface facing toward the gate structure, the gate insulating film extending along the bottom surface of the gate etching stop pattern.

20. A semiconductor device, comprising:

an active pattern including:

a lower pattern extending in a first direction, and a plurality of sheet patterns spaced apart from the lower pattern in a second direction, each of the plurality of sheet patterns having an upper surface and a bottom surface opposite to each other in the second direction;

a field insulating film covering a side wall of the lower pattern;

a gate structure on the lower pattern and the field insulating film, the gate structure extending in a third direction and including a gate electrode and a gate insulating film that surround each of the plurality of sheet patterns;

a gate etching stop pattern on the gate structure, the gate etching stop pattern overlapping the plurality of sheet patterns in the second direction without overlapping the field insulating film in the second direction;

a gate capping pattern on the gate structure and the gate etching stop pattern;

a gate spacer extending along a side wall of the gate capping pattern;

a source/drain pattern on at least one side of the gate structure;

a gate contact extending through the gate capping pattern and connected to the gate electrode, an upper surface of the gate contact being coplanar with an upper surface of the gate spacer; and a source/drain contact on the source/drain pattern and connected to the source/drain pattern, wherein in an area in which the gate structure overlaps the field insulating film, a vertical distance from an upper surface of the lower pattern to an upper surface of the gate structure is a first vertical distance, and wherein in an area in which the gate structure overlaps the plurality of sheet patterns, a vertical distance from the upper surface of the lower pattern to the upper surface of the gate structure is a second vertical distance, the second vertical distance is greater than the first vertical distance.

* * * * *